(12) United States Patent
Nishimura et al.

(10) Patent No.: US 12,232,319 B2
(45) Date of Patent: Feb. 18, 2025

(54) SEMICONDUCTOR MEMORY DEVICE

(71) Applicant: Kioxia Corporation, Tokyo (JP)

(72) Inventors: Takahito Nishimura, Kuwana (JP); Takuya Nishikawa, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 409 days.

(21) Appl. No.: 17/806,538

(22) Filed: Jun. 13, 2022

(65) Prior Publication Data

US 2023/0200069 A1  Jun. 22, 2023

(30) Foreign Application Priority Data

Dec. 17, 2021 (JP) ................. 2021-205073

(51) Int. Cl.
*H10B 43/27* (2023.01)
*H10B 43/40* (2023.01)

(52) U.S. Cl.
CPC ............. *H10B 43/27* (2023.02); *H10B 43/40* (2023.02)

(58) Field of Classification Search
CPC ...................................................... H10B 43/40
See application file for complete search history.

(56) References Cited

U.S. PATENT DOCUMENTS

| 10,892,273 | B2 | 1/2021 | Ito et al. | |
| 2009/0224309 | A1* | 9/2009 | Kidoh | H10B 43/27 257/326 |
| 2009/0230450 | A1* | 9/2009 | Shiino | H10B 43/27 257/314 |
| 2009/0267135 | A1* | 10/2009 | Tanaka | H10B 43/20 257/E21.585 |
| 2013/0056818 | A1* | 3/2013 | Iino | H10B 43/35 257/E21.09 |
| 2016/0079250 | A1* | 3/2016 | Akutsu | H10B 41/27 438/630 |
| 2016/0268304 | A1* | 9/2016 | Ikeda | H10B 43/40 |
| 2017/0069651 | A1* | 3/2017 | Sakamoto | H10B 43/40 |
| 2017/0103995 | A1* | 4/2017 | Hatano | H10B 41/40 |
| 2017/0263558 | A1 | 9/2017 | Shingu et al. | |
| 2017/0263639 | A1* | 9/2017 | Saito | G11C 16/08 |
| 2019/0296034 | A1* | 9/2019 | Nagashima | H01L 21/76805 |
| 2021/0066338 | A1 | 3/2021 | Otaguro et al. | |

FOREIGN PATENT DOCUMENTS

| JP | 2020-126938 A | 8/2020 |
| JP | 2021-34651 A | 3/2021 |

* cited by examiner

*Primary Examiner* — Evren Seven

(74) *Attorney, Agent, or Firm* — Oblon, McClelland, Maier & Neustadt, L.L.P.

(57) ABSTRACT

According to one embodiment, a semiconductor memory device includes: a stacked body that includes a plurality of conductive layers and a plurality of first insulating layers alternately stacked one by one and a stepped portion in which the plurality of conductive layers is processed in a stepped shape; and a plurality of second pillars that extends in the stacked body in the stepped portion, in which each of the plurality of second pillars includes a second insulating layer extending in the stacked body in the stacking direction, a semiconductor layer covering a side wall of the second insulating layer, a third insulating layer disposed in contact with a side wall of the semiconductor layer and covering the side wall of the semiconductor layer, and a fourth insulating layer disposed in contact with a side wall of the third insulating layer and covering the side wall of the third insulating layer.

20 Claims, 25 Drawing Sheets

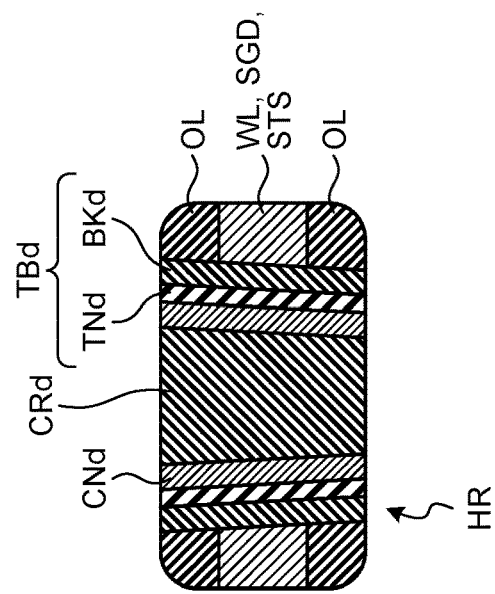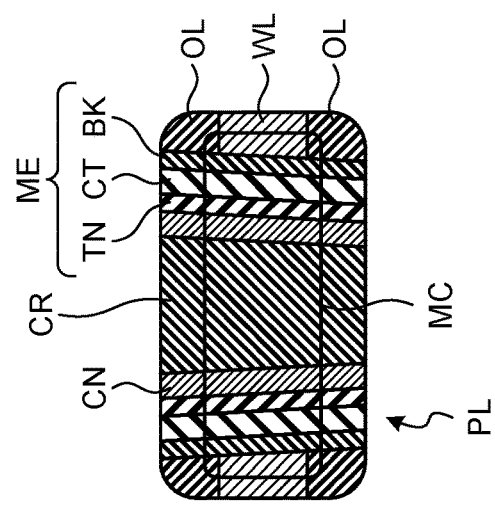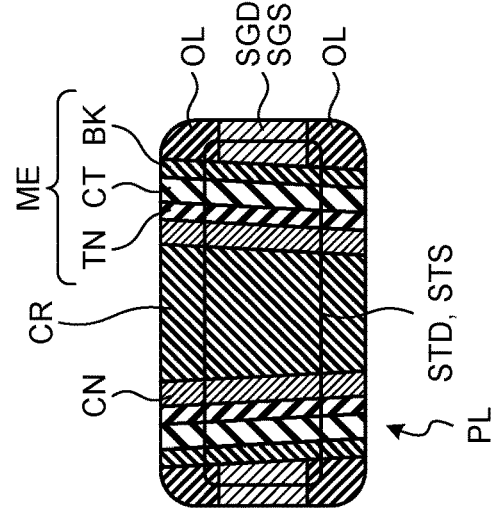

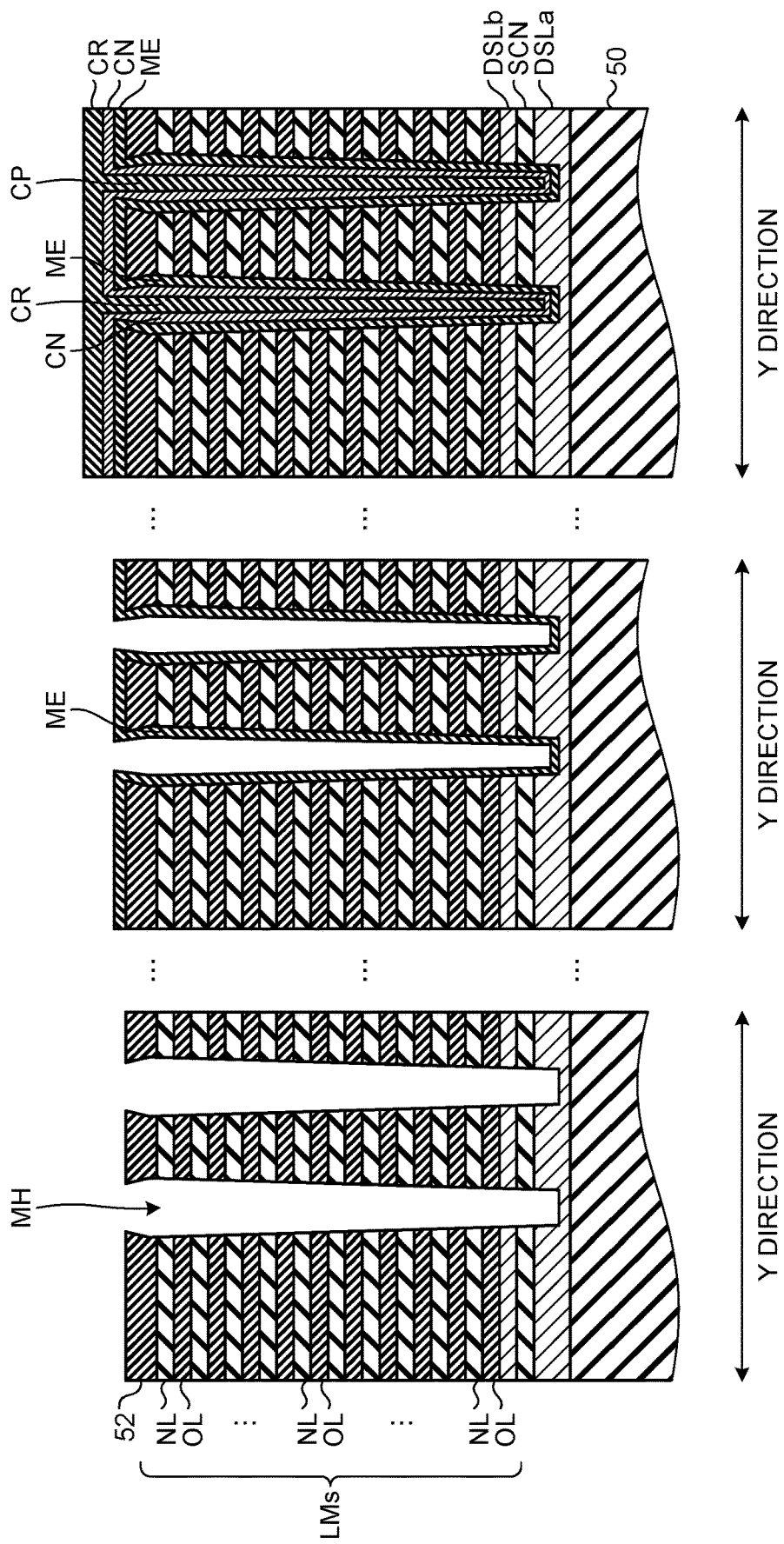

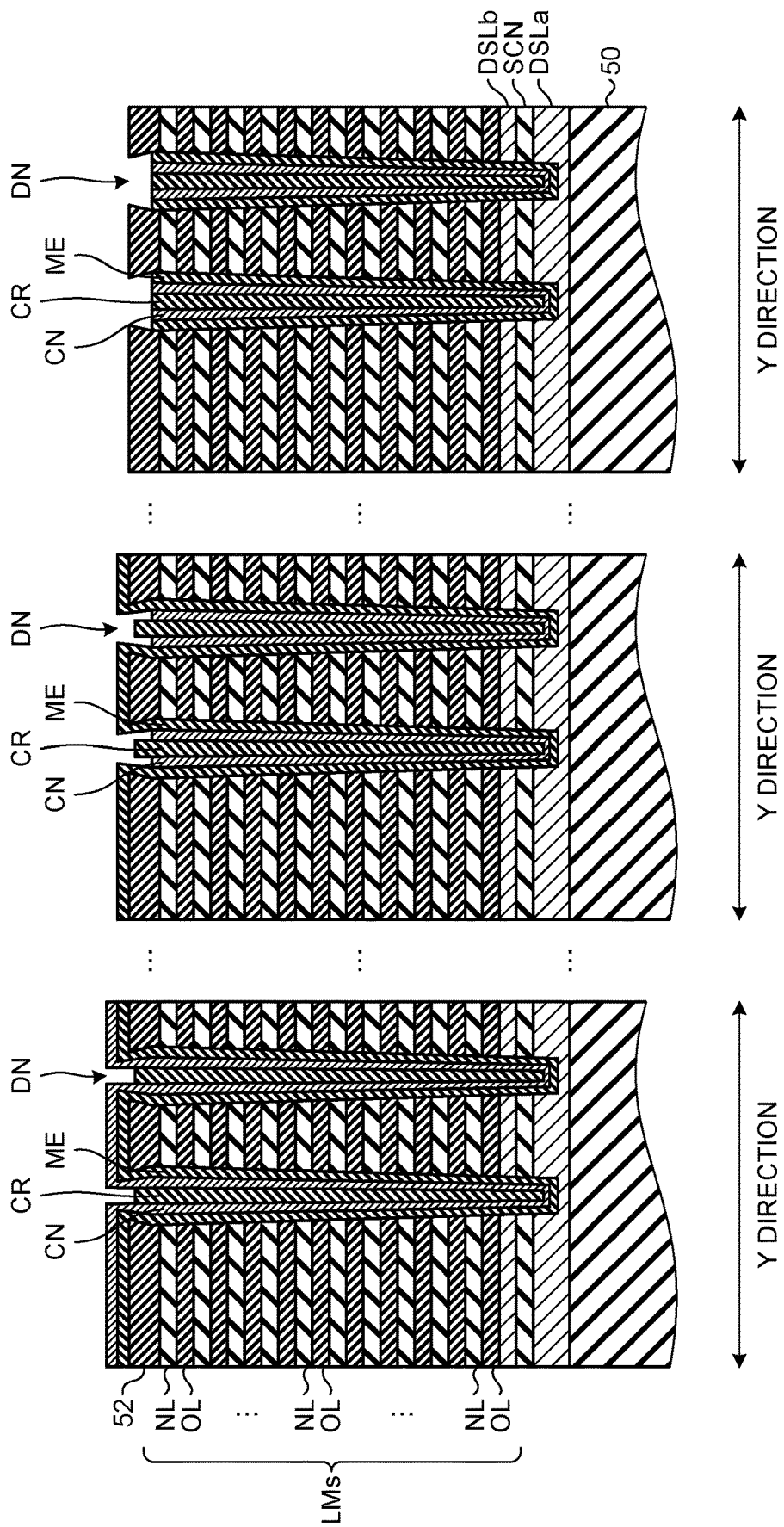

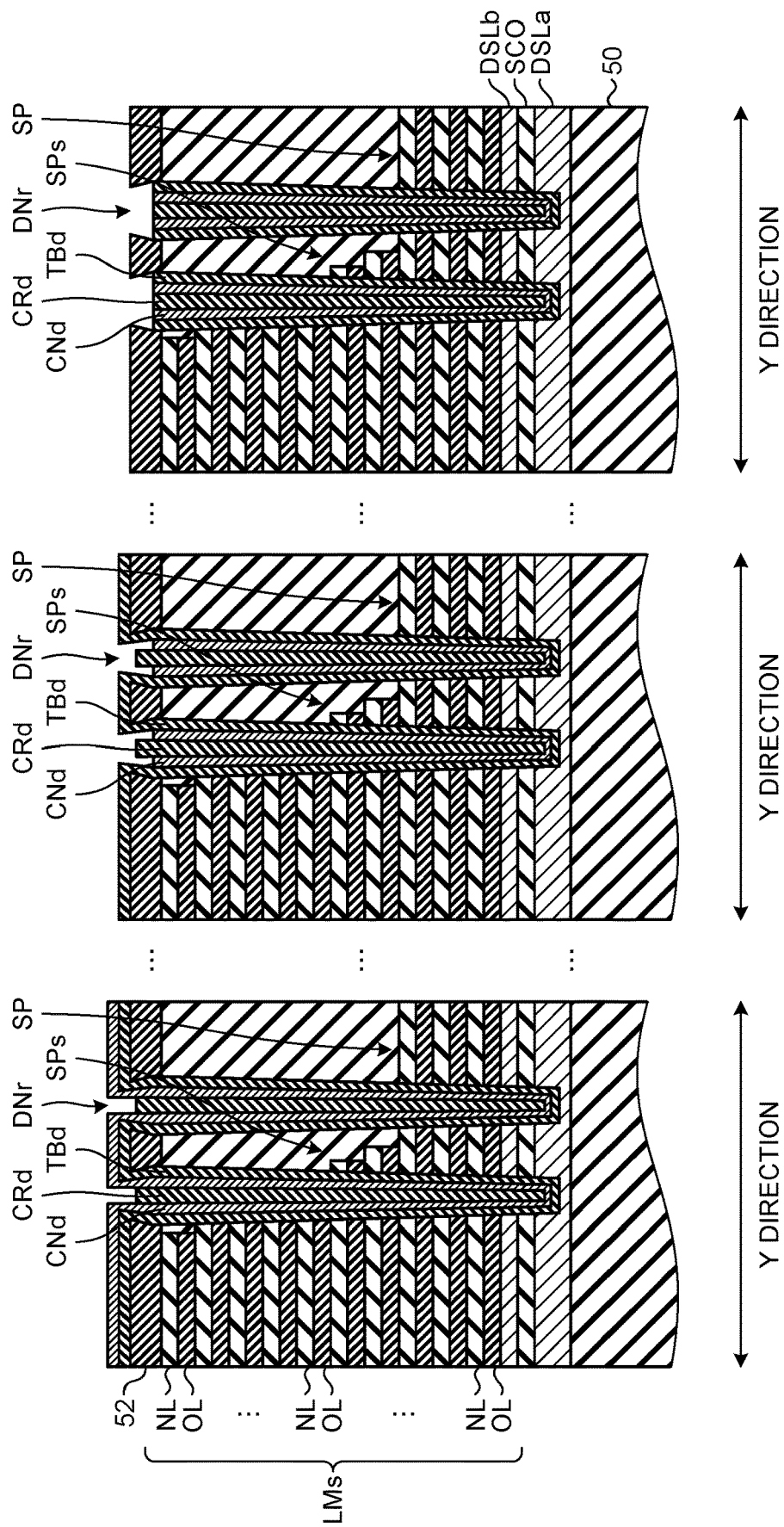

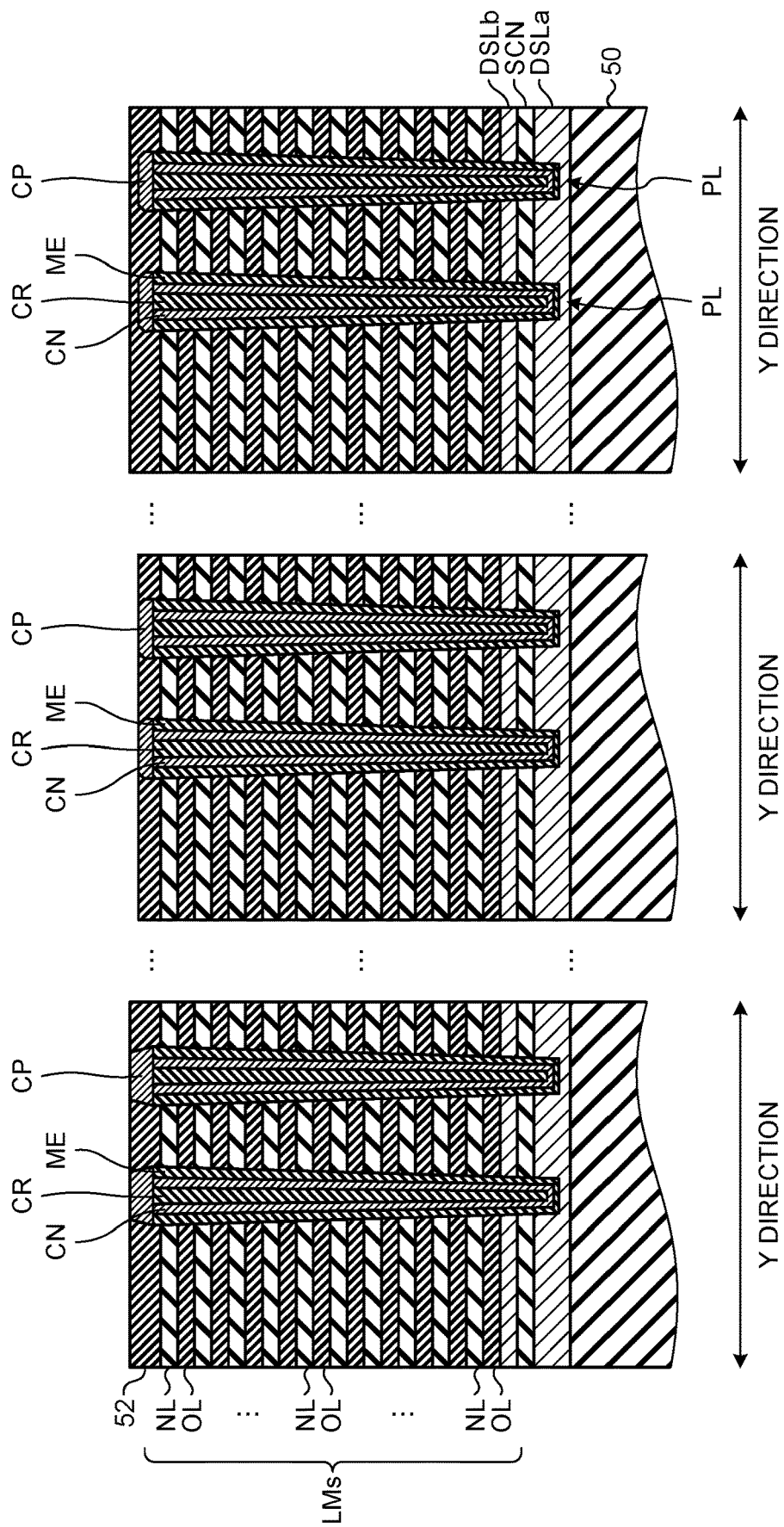

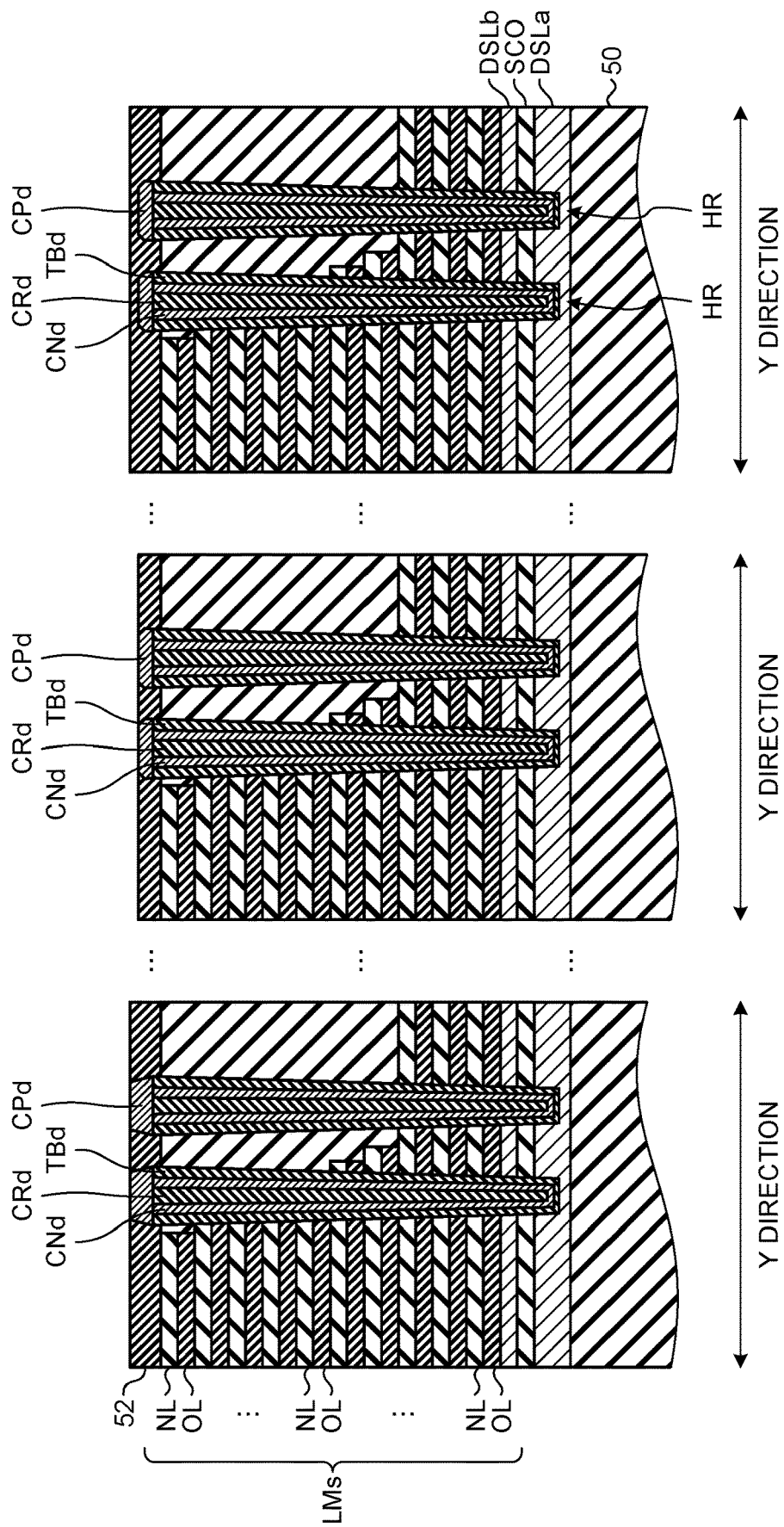

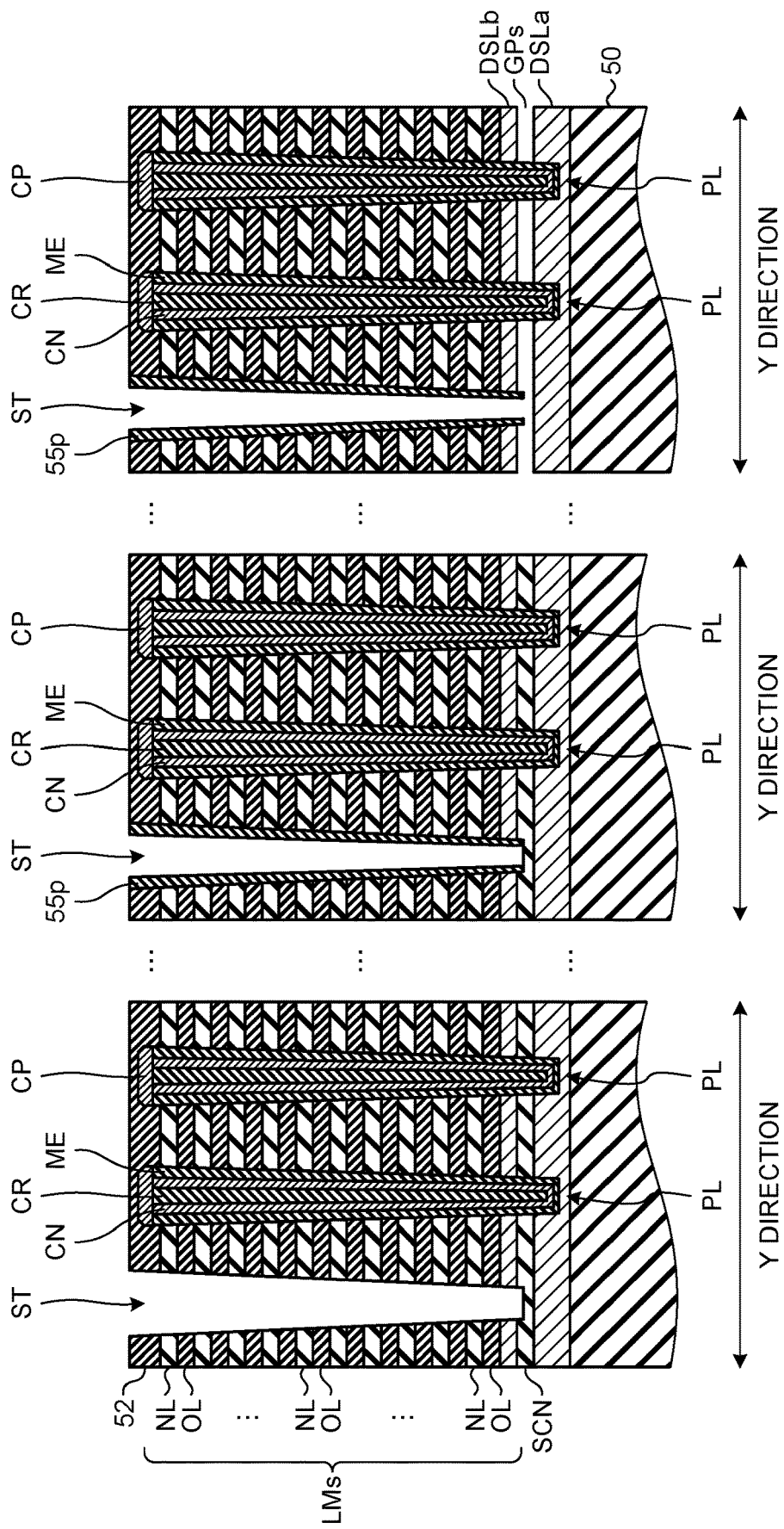

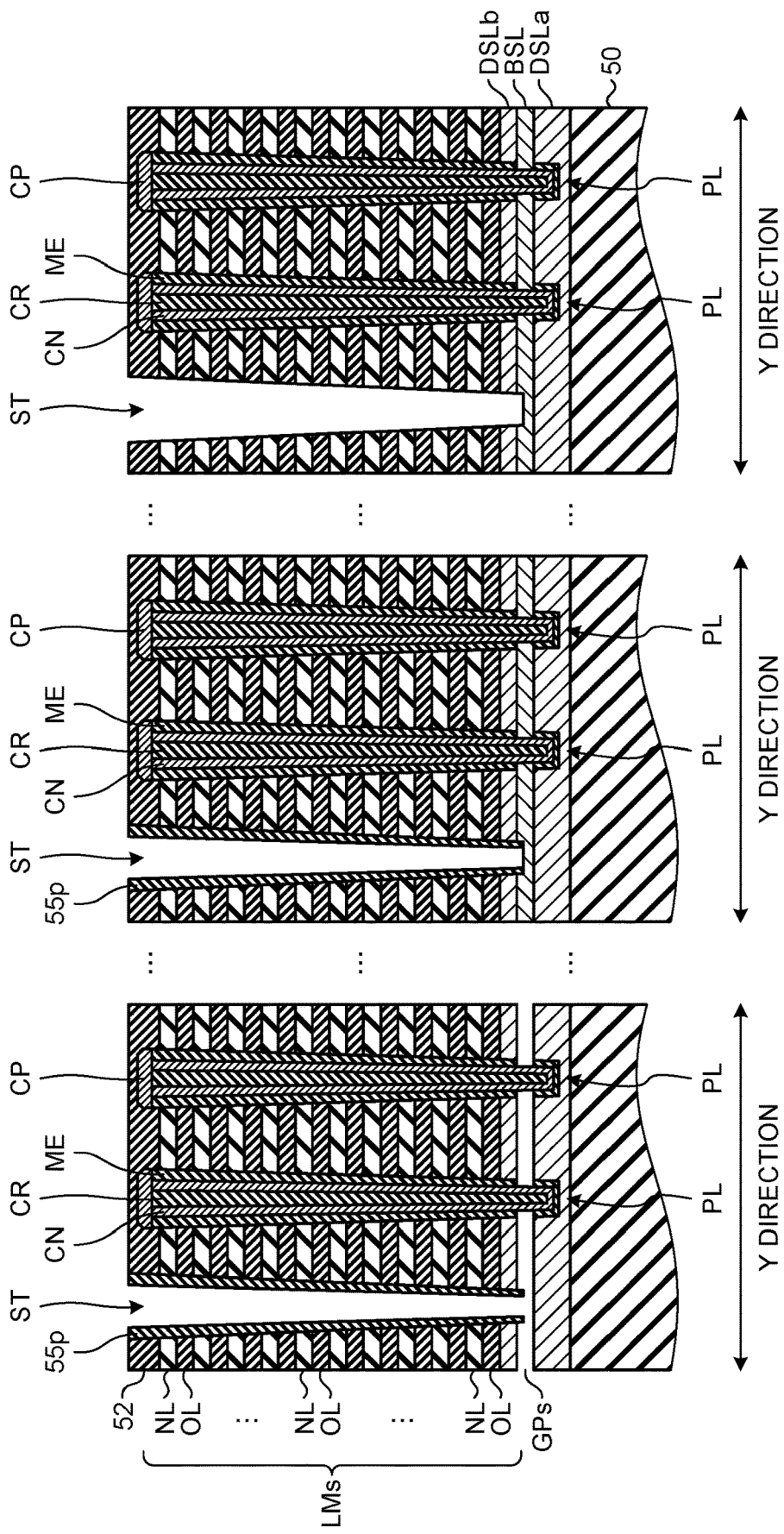

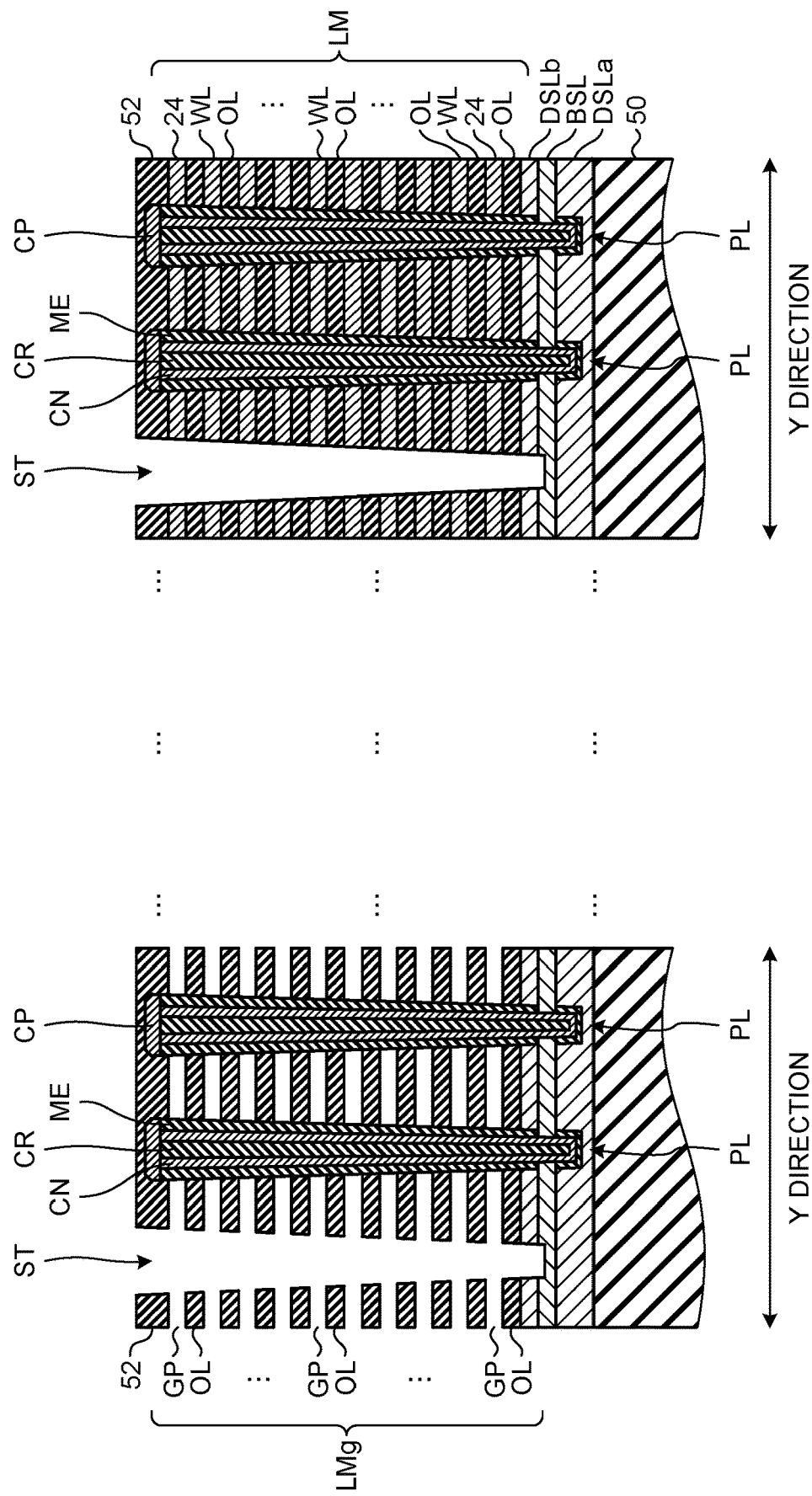

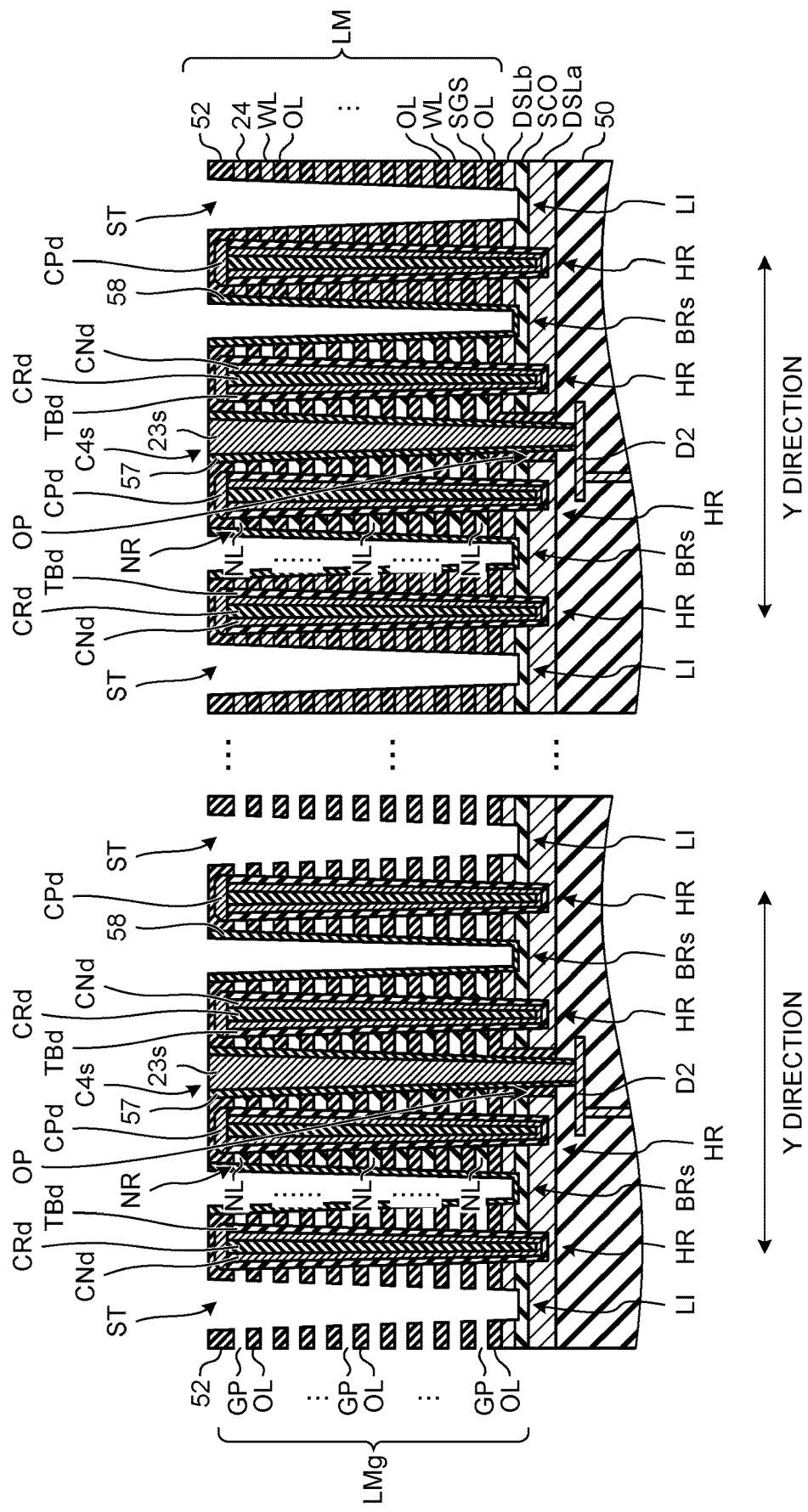

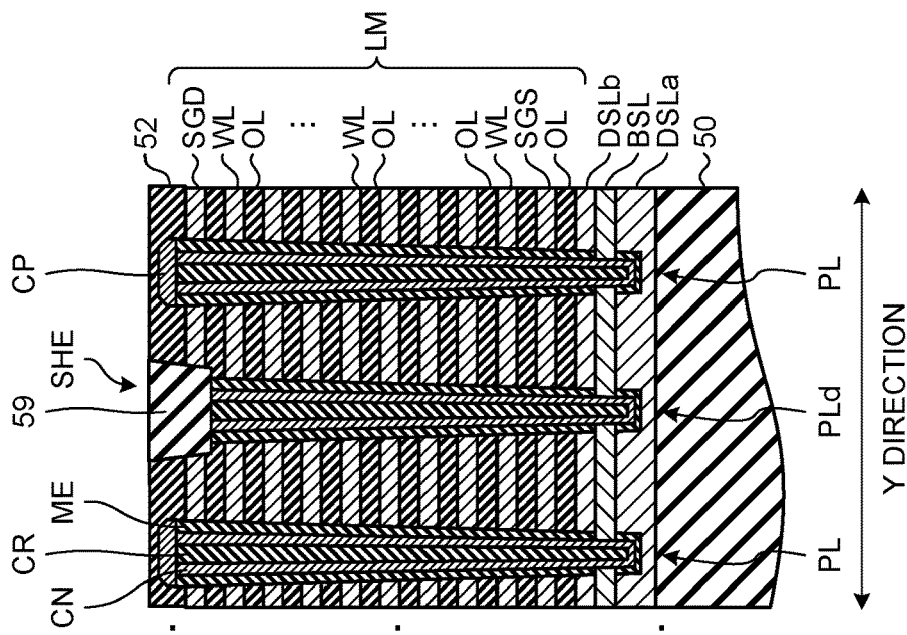
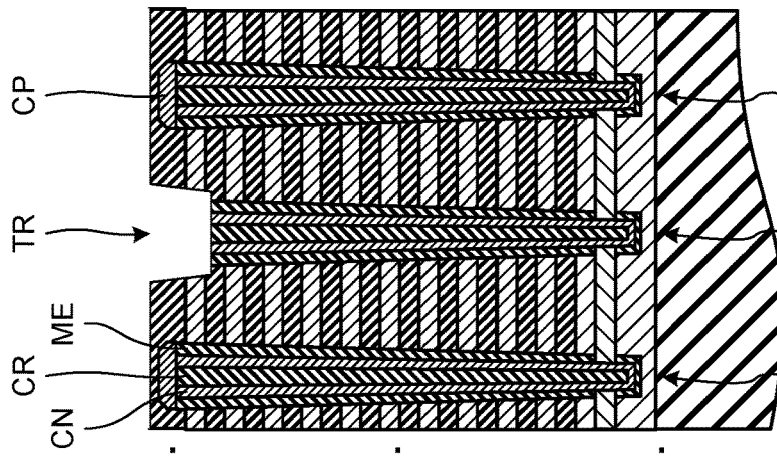
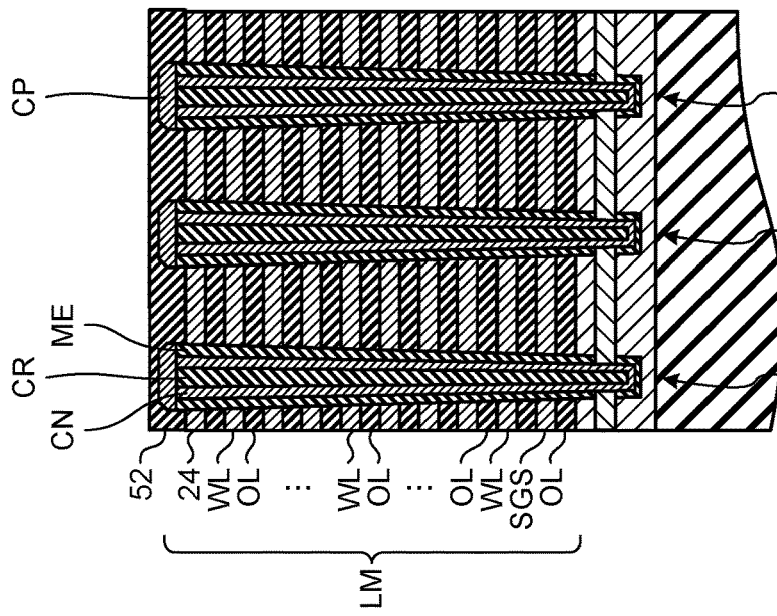

SEMICONDUCTOR MEMORY DEVICE

CROSS-REFERENCE TO RELATED APPLICATIONS

This application is based upon and claims the benefit of priority from Japanese Patent Application No. 2021-205073, filed on Dec. 17, 2021; the entire contents of which are incorporated herein by reference.

FIELD

Embodiments described herein relate generally to a semiconductor memory device.

BACKGROUND

In a semiconductor memory device such as a three-dimensional nonvolatile memory, memory cells are three-dimensionally arranged in a stacked body in which a plurality of conductive layers and a plurality of insulating layers are alternately stacked. However, the stacked body partially sinks in a stacking direction, as a result of which the stacked body may have an uneven upper surface.

BRIEF DESCRIPTION OF THE DRAWINGS

FIGS. 2A to 2E are cross-sectional views illustrating an example of a configuration of the semiconductor memory device according to the embodiment;

FIGS. 6A to 6C are views sequentially illustrating a part of the procedure of the method for manufacturing the semiconductor memory device according to the embodiment;

FIGS. 7Aa to 7Bc are views sequentially illustrating a part of the procedure of the method for manufacturing the semiconductor memory device according to the embodiment;

FIGS. 8Aa to 8Bc are views sequentially illustrating a part of the procedure of the method for manufacturing the semiconductor memory device according to the embodiment;

FIGS. 9A to 9C are views sequentially illustrating a part of the procedure of the method for manufacturing the semiconductor memory device according to the embodiment;

FIGS. 10A to 10C are views sequentially illustrating a part of the procedure of the method for manufacturing the semiconductor memory device according to the embodiment;

FIGS. 11Aa to 11Bb are views sequentially illustrating a part of the procedure of the method for manufacturing the semiconductor memory device according to the embodiment;

FIGS. 12A to 12C are views sequentially illustrating a part of the procedure of the method for manufacturing the semiconductor memory device according to the embodiment;

DETAILED DESCRIPTION

In general, according to one embodiment, a semiconductor memory device includes: a stacked body that includes a plurality of conductive layers and a plurality of first insulating layers alternately stacked one by one and includes a stepped portion in which the plurality of conductive layers is processed in a stepped shape; a first pillar that extends in a stacking direction of the stacked body in the stacked body away from the stepped portion in a first direction intersecting the stacking direction and forms a memory cell at each intersection with at least a part of the plurality of conductive layers; and a plurality of second pillars that extends in the stacking direction in the stacked body in the stepped portion, in which each of the plurality of second pillars includes a second insulating layer extending in the stacked body in the stacking direction, a semiconductor layer covering a side wall of the second insulating layer, a third insulating layer disposed in contact with a side wall of the semiconductor layer and covering the side wall of the semiconductor layer, and a fourth insulating layer disposed in contact with a side wall of the third insulating layer and covering the side wall of the third insulating layer, and the third and fourth insulating layers contain a same kind of material.

Exemplary embodiments of the semiconductor memory device will be explained below in detail with reference to the accompanying drawings. The present invention is not limited to the following embodiments. In addition, components in the following embodiments include those that can be easily assumed by those skilled in the art or those that are substantially the same.

Configuration Example of Semiconductor Memory Device

Figure 1A:
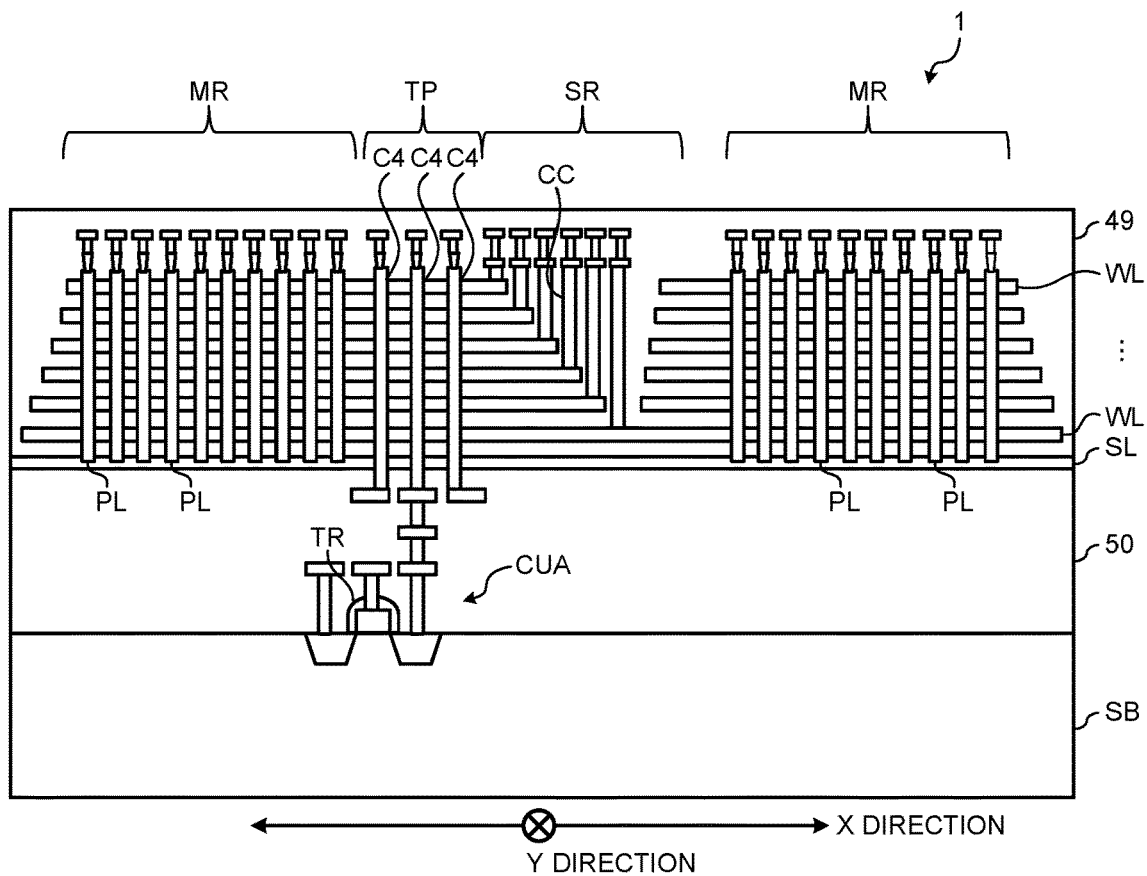
FIGS. 1A and 1B are views illustrating a schematic configuration example of a semiconductor memory device according to an embodiment.
Figure 1B:
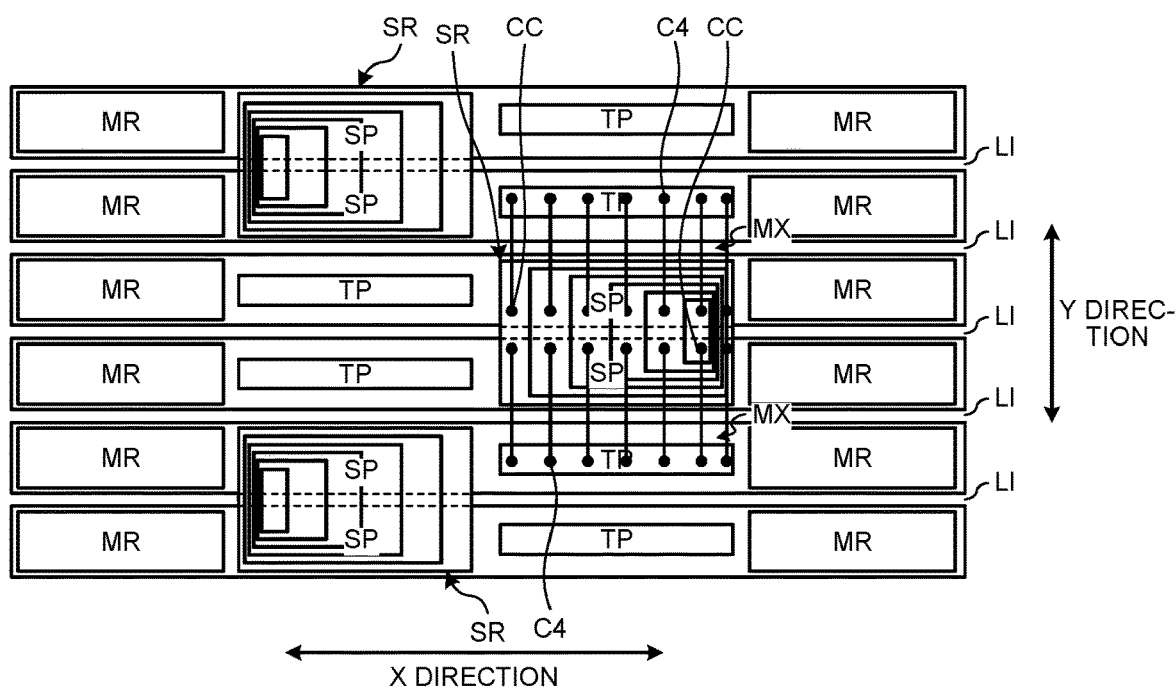

FIGS. 1A and 1B are views illustrating a schematic configuration example of a semiconductor memory device 1 according to an embodiment. FIG. 1A is a cross-sectional view, of the semiconductor memory device 1, along an X direction, and FIG. 1B is a schematic plan view illustrating a layout of the semiconductor memory device 1. However, in FIG. 1A, hatching is omitted in consideration of visibility of the drawing. In FIG. 1A, some select gate lines and upper layer wirings are omitted.

In the present specification, both the X direction and a Y direction are directions along a surface of a word line WL to be described later, and the X direction and the Y direction are orthogonal to each other. Further, an electrical drawing direction of the word line WL to be described later may be referred to as a first direction, and the first direction is a direction along the X direction. A direction intersecting the first direction may be referred to as a second direction, and the second direction is a direction along the Y direction. However, since the semiconductor memory device 1 may have a manufacturing variation, the first direction and the second direction are not necessarily orthogonal to each other.

As illustrated in FIGS. 1A and 1B, the semiconductor memory device 1 includes a peripheral circuit CUA, a memory region MR, a through contact region TP, and a stepped region SR on a substrate SB.

The substrate SB is, for example, a semiconductor substrate such as a silicon substrate. The peripheral circuit CUA including a transistor TR, a wiring, and the like is disposed on the substrate SB. The peripheral circuit CUA contributes to an operation of a memory cell described later.

The peripheral circuit CUA is covered with an insulating layer 50. A source line SL is disposed on the insulating layer 50. A plurality of word lines WL is stacked on the source line SL. The plurality of word lines WL is covered with an insulating layer 49. The insulating layer 49 also extends in the peripheral of the plurality of word lines WL.

A plurality of plate contacts LI penetrating through the word lines WL in the stacking direction and extending in the X direction are arranged in the plurality of word lines WL. As a result, the plurality of word lines WL is divided in the Y direction by the plurality of plate contacts LI.

A plurality of memory regions MR, the stepped region SR, and the through contact region TP are arranged side by side in the X direction between the plurality of plate contacts LI. The plurality of memory regions MR are away from each other in the X direction with the stepped region SR and the through contact region TP interposed therebetween.

In the memory region MR, a plurality of pillars PL penetrating through the word lines WL in the stacking direction is disposed. A plurality of memory cells is formed at intersections between the pillars PL and the word lines WL. As a result, the semiconductor memory device 1 is configured as, for example, a three-dimensional nonvolatile memory in which memory cells are three-dimensionally arranged in the memory region MR.

The stepped region SR includes a plurality of stepped portions SP in which the plurality of word lines WL is dug down in a mortar shape in the stacking direction. For example, two stepped portions SP arranged in the Y direction while having one plate contact LI interposed therebetween are disposed in one stepped region SR.

The stepped portion SP forms one side of a mortar shape descending stepwise from the both sides of the X direction and one side of the Y direction toward a bottom surface. However, the other side of the stepped portion SP in the Y direction is opened toward a side surface of the plate contact LI.

Each step of the stepped portion SP is configured by the word line WL of each layer. The word line WL of each layer maintains electrical conduction on the both sides of the X direction of the stepped portion SP through a stepped part on one side of the Y direction of the stepped portion SP. A contact CC connecting the word line WL of each layer and an upper layer wiring MX is disposed in a terrace portion of each step of the stepped portion SP.

As a result, the word lines WL stacked in multiple layers can be individually drawn. A write voltage, a read voltage, and the like are applied from these contacts CC to the memory cells in the memory regions MR on the both sides in the X direction via the word lines WL at the same height positions as those of the memory cells.

In the present specification, a direction in which a terrace surface of each step of the stepped portion SP faces is defined as a top direction.

The through contact region TP is disposed on one side of the stepped region SR in the X direction. A through contact C4 penetrating through the plurality of word lines WL is disposed in the through contact region TP. The through contact C4 connects the peripheral circuit CUA disposed on the lower substrate SB and the upper layer wiring MX connected to the contact CC of the stepped portion SP. Various voltages applied from the contact CC to the memory cell are controlled by the peripheral circuit CUA via the through contact C4, the upper layer wiring MX, and the like.

Next, a detailed configuration example of the semiconductor memory device 1 will be described with reference to FIGS. 2A to 2E. FIGS. 2A to 2E are cross-sectional views illustrating an example of a configuration of the semiconductor memory device 1 according to the embodiment.

Figure 2A:
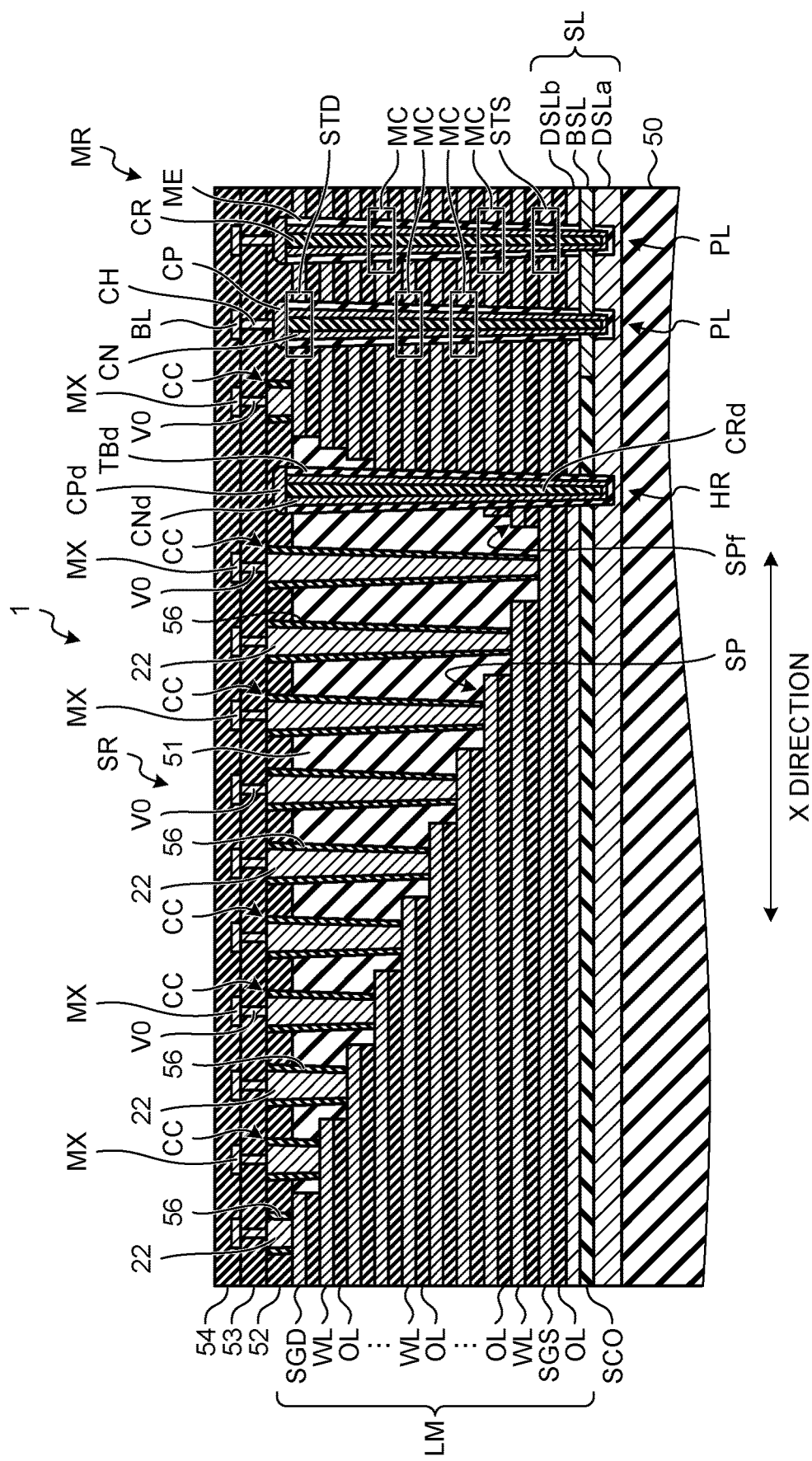
Figure 2B:
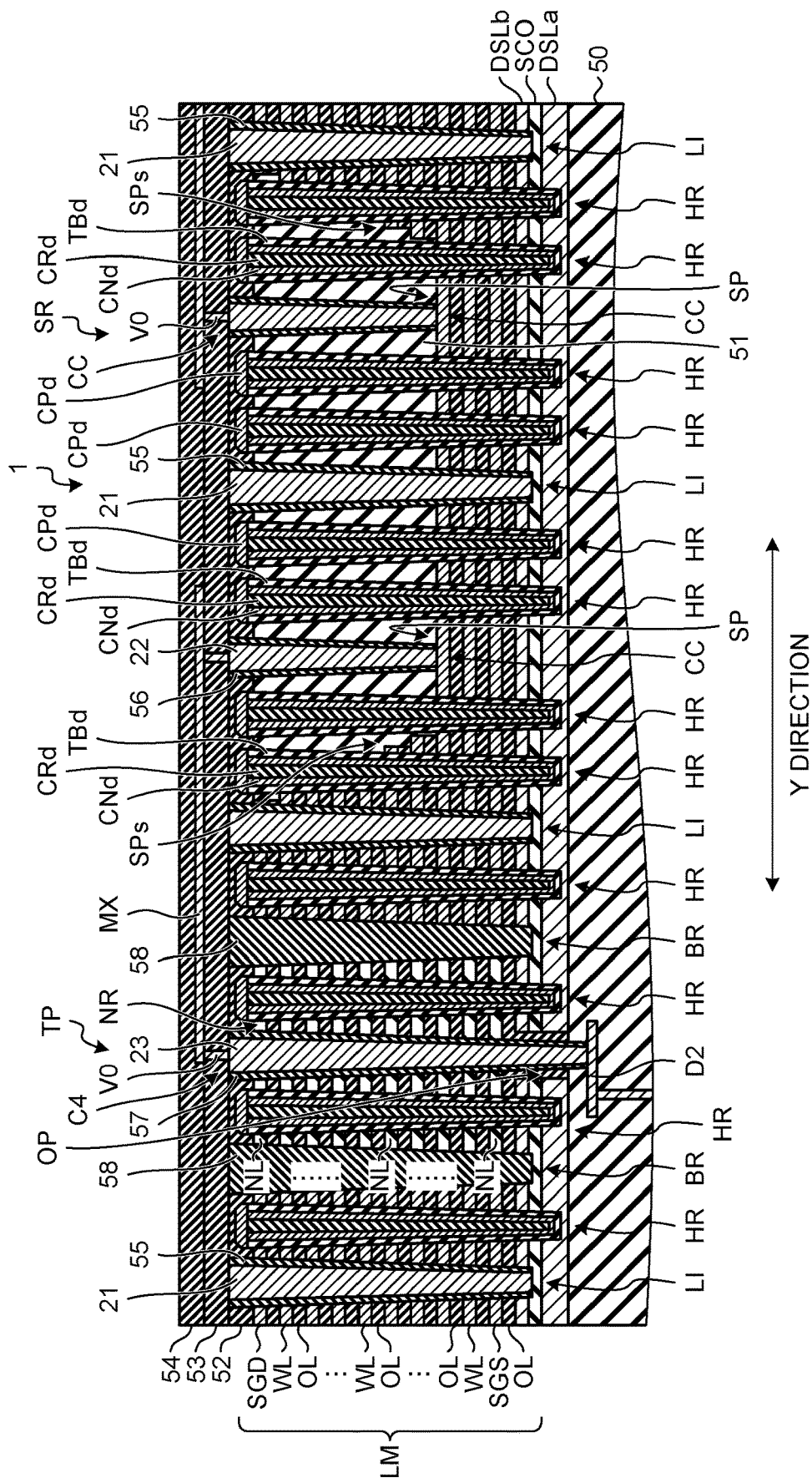

FIG. 2A is a cross-sectional view, including the memory region MR and the stepped region SR, along the X direction. FIG. 2B is a cross-sectional view, including the stepped region SR and the through contact region TP, along the Y direction. However, in FIGS. 2A and 2B, the structures below the insulating layer 50 such as the substrate SB and the peripheral circuit CUA are omitted.

FIGS. 2C and 2D are partially enlarged views illustrating a cross section of the pillar PL disposed in the memory region MR. FIG. 2E is a partially enlarged view illustrating a cross section of columnar portions HR disposed in the stepped region SR and the through contact region TP.

As illustrated in FIGS. 2A and 2B, the source line SL has a multilayer structure in which, for example, a lower source line DSLa, an intermediate source line BSL or intermediate insulating layer SCO, and an upper source line DSLb are stacked in this order on the insulating layer 50.

The lower source line DSLa, the intermediate source line BSL, and the upper source line DSLb are, for example, polysilicon layers. Among them, at least the intermediate source line BSL may be a conductive polysilicon layer or the like in which impurities are diffused. The intermediate source line BSL is disposed below the memory region MR of the stacked body LM.

The intermediate insulating layer SCO is, for example, a silicon oxide layer or the like. The intermediate insulating layer SCO is disposed below the stepped region SR, the through contact region TP, and the like of the stacked body LM.

The stacked body LM is disposed above the source line SL. In the stacked body LM, the plurality of word lines WL and a plurality of insulating layers OL are alternately stacked one by one. A select gate line SGD is disposed above the uppermost word line WL while having the insulating layer OL interposed therebetween. A select gate line SGS is disposed below the lowermost word line WL while having the insulating layer OL interposed therebetween. The number of the word lines WL and the select gate lines SGD and SGS stacked in the stacked body LM is arbitrary.

The word line WL and the select gate lines SGD and SGS serving as a plurality of conductive layers are, for example, tungsten layers or molybdenum layers. The insulating layers OL serving as a plurality of first insulating layers are, for example, silicon oxide layers.

The upper surface of the stacked body LM is covered with an insulating layer 52. The insulating layer 52 is covered with an insulating layer 53. The insulating layer 53 is covered with an insulating layer 54. The insulating layers 52 to 54 constitutes a part of the insulating layer 49 of FIG. 1A together with an insulating layer 51 described later.

As illustrated in FIG. 2B, the stacked body LM is divided in the Y direction by the plurality of plate contacts LI.

The plate contacts LI serving as plate members are arranged in the Y direction and extend in the stacking direction of the stacked body LM and the direction along the X direction. That is, the plate contact LI penetrates through the insulating layer 52, the stacked body LM, and the upper source line DSLb, reaches the intermediate insulating layer SCO in the stepped region SR, the through contact region TP, and the like, and reaches the intermediate source line BSL in the memory region MR. The plate contact LI continuously extends in the stacked body LM from one end portion to the other end portion of the stacked body LM in the X direction.

Each of the plate contacts LI includes an insulating layer 55 and a conductive layer 21. The insulating layer 55 is, for example, a silicon oxide layer or the like. The conductive layer 21 is, for example, a tungsten layer or a conductive polysilicon layer.

The insulating layer 55 covers side walls of the plate contact LI that face each other in the Y direction. The conductive layer 21 fills the inner side of the insulating layer 55, and is electrically connected to the source line SL including the intermediate source line BSL at a position different from that in the cross section in FIG. 2B. In addition, the conductive layer 21 is connected to the upper layer wiring MX disposed in the insulating layer 54 via a plug V0 disposed in the insulating layer 53 at a position different from that in the cross section illustrated in FIG. 2B. With such a configuration, the plate contact LI functions as a source line contact.

However, instead of the plate contact LI, a plate member filled with an insulating layer may penetrate through the stacked body LM and extend in the X direction, thereby dividing the stacked body LM in the Y direction. In this case, such a plate member does not function as a source line contact.

As illustrated in FIG. 2A, the plurality of pillars PL that penetrates through the stacked body LM, the upper source line DSLb, and the intermediate source line BSL and reaches the lower source line DSLa is dispersedly arranged in the memory region MR.

The pillars PL serving as a plurality of first pillars are arranged in, for example, a staggered pattern when viewed from the stacking direction of the stacked body LM. A cross-sectional shape of each pillar PL in a direction along a layer direction of the stacked body LM, that is, a direction along an XY plane is, for example, a circular shape, an elliptical shape, an oval shape, or the like.

Each of the plurality of pillars PL includes a memory layer ME extending in the stacked body LM in the stacking direction, a channel layer CN penetrating through the stacked body LM and connected to the intermediate source line BSL, a cap layer CP covering the upper surface of the channel layer CN, and a core layer CR serving as a core material of the pillar PL.

As illustrated in FIGS. 2C and 2D, the memory layer ME has a multilayer structure in which a block insulating layer BK serving as a fourth insulating layer, a charge accumulation layer CT serving as a fifth insulating layer, and a tunnel insulating layer TN serving as a third insulating layer are stacked in this order from the outer peripheral side of the pillar PL. More specifically, the memory layer ME is disposed on the side surface of the pillar PL except for a depth position of the intermediate source line BSL. The memory layer ME is also disposed on the bottom surface of the pillar PL reaching the lower source line DSLa.

The channel layer CN penetrates through the stacked body LM, the upper source line DSLb, and the intermediate source line BSL and reaches the lower source line DSLa inside the memory layer ME. The side surface of the channel layer CN is in contact with the intermediate source line BSL and is thus electrically connected to the source line SL including the intermediate source line BSL. The core layer CR serving as a second insulating layer fills the further inner side of the channel layer CN.

The cap layer CP is provided at the upper end portion of each of the plurality of pillars PL. The cap layer CP is disposed in the insulating layer 52 so as to cover at least the upper end portion of the channel layer CN, and is connected to the channel layer CN. The cap layer CP is connected to a bit line BL disposed in the insulating layer 52 via a plug CH disposed in the insulating layers 53 and 54.

The block insulating layer BK and the tunnel insulating layer TN of the memory layer ME, and the core layer CR are, for example, silicon oxide layers or the like. The charge accumulation layer CT of the memory layer ME is, for example, a silicon nitride layer or the like. The channel layer CN and the cap layer CP are semiconductor layers such as polysilicon layers or amorphous silicon layers.

As illustrated in FIG. 2D, with the above configuration, a memory cell MC is formed in each portion of the side surface of the pillar PL that faces each word line WL. When a predetermined voltage is applied from the word line WL, data is written to and read from the memory cell MC.

As illustrated in FIG. 2C, select gates STD and STS are formed in portions of the side surface of the pillar PL that face the select gate line SGD or SGS disposed above or below the word lines WL. When a predetermined voltage is applied from each of the select gate lines SGD and SGS, the select gates STD and STS are turned on or off, so that the memory cells MC of the pillars PL to which the select gates STD and STS belong can be brought into a selected state or a non-selected state.

As illustrated in FIG. 2B, the through contact C4, an insulating portion NR, and a plate portion BR are disposed in the through contact region TP.

The insulating portion NR is a portion which is disposed inner side the stacked body LM when viewed from the stacking direction of the stacked body LM and in which a plurality of insulating layers NL and the plurality of insulating layers OL are alternately stacked one by one. The plurality of insulating layers NL is, for example, silicon nitride layers, and are arranged at height positions corresponding to the plurality of word lines WL and the select gate lines SGD and SGS, respectively.

The plate portion BR is disposed on the both sides of the insulating portion NR in the Y direction. The plate portion BR extends in the X direction in the through contact region TP at a position between the plate contacts LI adjacent to each other, penetrates through the stacked body LM and the upper source line DSLb, and reaches the intermediate insulating layer SCO.

As will be described later, when forming the stacked body LM from a stacked body in which a sacrificial layer and an insulating layer are stacked, the sacrificial layer remains without being replaced with the word line WL or the like at a portion sandwiched between the plate portions BR, and is maintained as the insulating layer NL of the insulating portion NR.

In the insulating portion NR, a plurality of through contacts C4 is arranged, for example, in the X direction (See FIG. 1A). However, the plurality of through contacts C4 may be arranged in the Y direction instead of or in addition to the X direction, in the through contact region TP.

The through contact C4 penetrates through the insulating layer 52 and the insulating portion NR, passes through, for example, an opening OP provided in the source line SL, and reaches the insulating layer 50 covering the peripheral circuit CUA (see FIG. 1A).

The through contact C4 includes an insulating layer 57 covering the outer periphery of the through contact C4, and a conductive layer 23 such as a tungsten layer or a copper layer filling the inner side of the insulating layer 57.

The conductive layer 23 is connected to the upper layer wiring MX disposed in the insulating layer 54 via the plug V0 disposed in the insulating layer 53 above the stacked body LM. In addition, the conductive layer 23 is connected to the peripheral circuit CUA via a lower layer wiring D2 disposed in the insulating layer 50 below the stacked body LM. As a result, the through contact C4 connects the components disposed above and below the stacked body LM.

Since the through contact C4 is disposed in the insulating portion NR that does not include the word line WL or the like and the conductive layer 23 of the through contact C4 is covered with the insulating layer 57, a withstand voltage between the through contact C4 and the word line WL or the like of the stacked body LM is maintained.

Note that a component that is not necessarily on the same cross section, such as a columnar portion HR to be described later disposed in the through contact region TP, and the through contact C4, is also illustrated in FIG. 2B, for convenience of explanation.

As illustrated in FIGS. 2A and 2B, stepped portions SP, SPf, and SPs are disposed in the stepped region SR. Each of the stepped portions SP, SPf, and SPs has a shape in which the plurality of word lines WL and the plurality of insulating layers OL are processed in a stepped shape.

Among these stepped portions SP, SPf, and SPs, the stepped portion SP has a function of electrically drawing the plurality of word lines WL to the upper layer wiring MX. On the other hand, the entire stepped portion SPs and a stepped part of the stepped portion SPf formed by the word lines WL are dummy stepped portions that do not contribute to the function of the semiconductor memory device 1. Such dummy stepped portions are also disposed at the both end portions of the stacked body LM in the X direction and the both end portions of the stacked body LM in the Y direction.

The stepped portion SP extends in the X direction at a position close to the through contact TP away from the memory region MR, and descends toward the memory region MR. The stepped portion SPf extends in the X direction so as to face the stepped portion SP at a position close to the memory region MR and descends toward the stepped portion SP.

The stepped portion SPs is disposed in the vicinity of the plate contact LI on one sides of the stepped portions SP and SPf in the Y direction at a position between the stepped portions SP and SPf. The stepped portion SPs extends in the Y direction so as to face the plate contact LI on the other side adjacent in the Y direction, and descends toward the plate contact LI on the other side.

Here, in the stepped portions SPf and SPs, the terrace portion of each step is shorter than the terrace portion of the stepped portion SP. Therefore, the stepped portions SPf and SPs have a steeper shape than the stepped portion SP, and the step length, that is, the length from the uppermost step to the lowermost step is smaller than that of the stepped portion SP.

As the stepped portions SP, SPf, and SPs are disposed in this manner, the stacked body LM has a shape recessed in a mortar shape in the stepped region SR. In this mortar-shaped region, the insulating layer 51 serving as a sixth insulating layer such as a silicon oxide layer is disposed so as to cover the upper surfaces of the stepped portions SP, SPf, and SPs. The above-described insulating layers 52 to 54 also cover the upper surface of the insulating layer 51.

In the stepped region SR, the insulating layer 51 is disposed on the stepped portions SP, SPf, and SPs while having an insulating layer such as a silicon nitride layer (not illustrated) interposed therebetween. The insulating layer (not illustrated) is disposed along the stepped shape of the word lines WL and the select gate lines SGD and SGS.

The contacts CC penetrating through the insulating layers 52 and 51 are connected to the word lines WL and the select gate lines SGD and SGS constituting the respective steps of the stepped portion SP. In addition, the contact CC connected to the select gate line SGD is also disposed in a stepped part of the stepped portion SPf formed by the select gate line SGD.

The contact CC includes an insulating layer 56 covering the outer periphery of the contact CC and a conductive layer 22 such as a tungsten layer or a copper layer filling the inner side of the insulating layer 56. The conductive layer 22 is connected to the upper layer wiring MX disposed in the insulating layer 54 via the plug V0 disposed in the insulating layer 53. As described above, the upper layer wiring MX is connected to the through contact C4 of the through contact region TP adjacent in the Y direction via the plate contact LI, for example.

With such a configuration, the word lines WL of the respective layers and the select gate lines SGD and SGS of the upper and lower layers of the word lines WL can be electrically drawn. That is, with the above configuration, a predetermined voltage is applied from the peripheral circuit CUA to the memory cell MC via the through contact C4, the contact CC, the word line WL, and the like, and the memory cell MC can be operated as a memory element.

Here, FIG. 2B illustrates a cross section of the third step from the lowermost step of the stepped portion SP. That is, FIG. 2B illustrates a portion where the second word line WL from the lowermost word line WL becomes the terrace surface. In FIG. 2B, the stepped portion SP is disposed on both sides of the plate contact LI in the Y direction illustrated in the central portion of the stepped region SR. The stepped portion SPs is disposed on the opposite side of the plate contact LI in the Y direction of each stepped portion SP.

In addition, a plurality of columnar portions HR penetrating through the insulating layer 51, the stacked body LM, the upper source line DSLb, and the intermediate insulating layer SCO and reaching the lower source line DSLa is dispersedly arranged in the stepped region SR including the stepped portions SP, SPf, and SPs.

The columnar portions HR serving as a plurality of second pillars are arranged in a staggered or grid pattern while avoiding interference with the contact CC. A cross-sectional shape of each of the columnar portions HR in the direction along the XY plane is, for example, a circular shape, an elliptical shape, an oval shape, or the like.

Each of the plurality of columnar portions HR does not have, for example, a portion corresponding to the charge accumulation layer CT among the layer structure of the pillar PL described above, and thus, does not contribute to the function of the semiconductor memory device 1. As will be described later, the columnar portion HR has a role of supporting the stacked body in which the sacrificial layer and the insulating layer are stacked, when forming the stacked body LM from the stacked body with the sacrificial layer.

More specifically, the columnar portion HR includes dummy layers TBd, CNd, and CRd extending in the stacked body LM in the stacking direction.

As illustrated in FIG. 2E, the dummy layer TBd has a multilayer structure in which a dummy layer BKd serving as a fourth insulating layer and a dummy layer TNd serving as a third insulating layer are stacked in this order from the outer peripheral side of the columnar portion HR. The dummy layer TBd corresponds to the memory layer ME of the pillar PL described above, and the dummy layers BKd and TNd included in the dummy layer TBd correspond to the block insulating layer BK and the tunnel insulating layer TN of the pillar PL, respectively.

However, unlike the memory layer ME of the pillar PL, the dummy layer TBd does not include a layer corresponding to the charge accumulation layer CT. Further, the dummy layer TBd is disposed without being interrupted on the side surface of the columnar portion HR from the upper source line DSLb to the lower source line DSLa. The dummy layer TBd is also disposed at the lower end portion of the columnar portion HR.

The dummy layer CNd penetrates through the insulating layer 51, the stacked body LM, the upper source line DSLb, and the intermediate insulating layer SCO on the inner side of the dummy layer TBd and reaches the lower source line DSLa. The dummy layer CNd corresponds to the channel layer CN of the pillar PL described above.

However, the dummy layer TBd is disposed on the side surface of the dummy layer CNd extending from the upper source line DSLb to the lower source line DSLa, and the dummy layer CNd is not in direct contact with the intermediate insulating layer SCO. A dummy layer CRd serving as a second insulating layer fills the further inner side of the dummy layer CNd. The dummy layer CRd corresponds to the core layer CR of the pillar PL described above and is served as the core material of the columnar portion HR.

In addition, the dummy layer CPd is provided at the upper end portion of each of the plurality of columnar portions HR. The dummy layer CPd is disposed in the insulating layer 52 so as to cover at least the upper end portion of the dummy layer CNd, and is connected to the dummy layer CNd. The dummy layer CPd corresponds to the cap layer CP of the pillar PL described above. Note that the columnar portion HR does not have to include the dummy layer CPd.

Each layer included in the columnar portion HR includes the same type of material as that of each corresponding layer of the pillar PL. That is, the dummy layers BKd and TNd of the dummy layer TBd, and the dummy layer CRd are, for example, silicon oxide layers or the like. The dummy layers CNd and CPd are semiconductor layers such as polysilicon layers or amorphous silicon layers. Here, the semiconductor layer included in the dummy layer CNd or the like has, for example, a higher Young's modulus than that of the material included in other dummy layers BKd, TNd, and CRd, and has a property of being hard and hardly deformed.

Note that the plurality of columnar portions HR is also dispersedly arranged in the through contact region TP while avoiding interference with the through contact C4. In addition, the plurality of columnar portions HR is also dispersedly arranged in dummy stepped portions at both end portions of the stacked body LM in the X direction and the Y direction.

Figure 3:
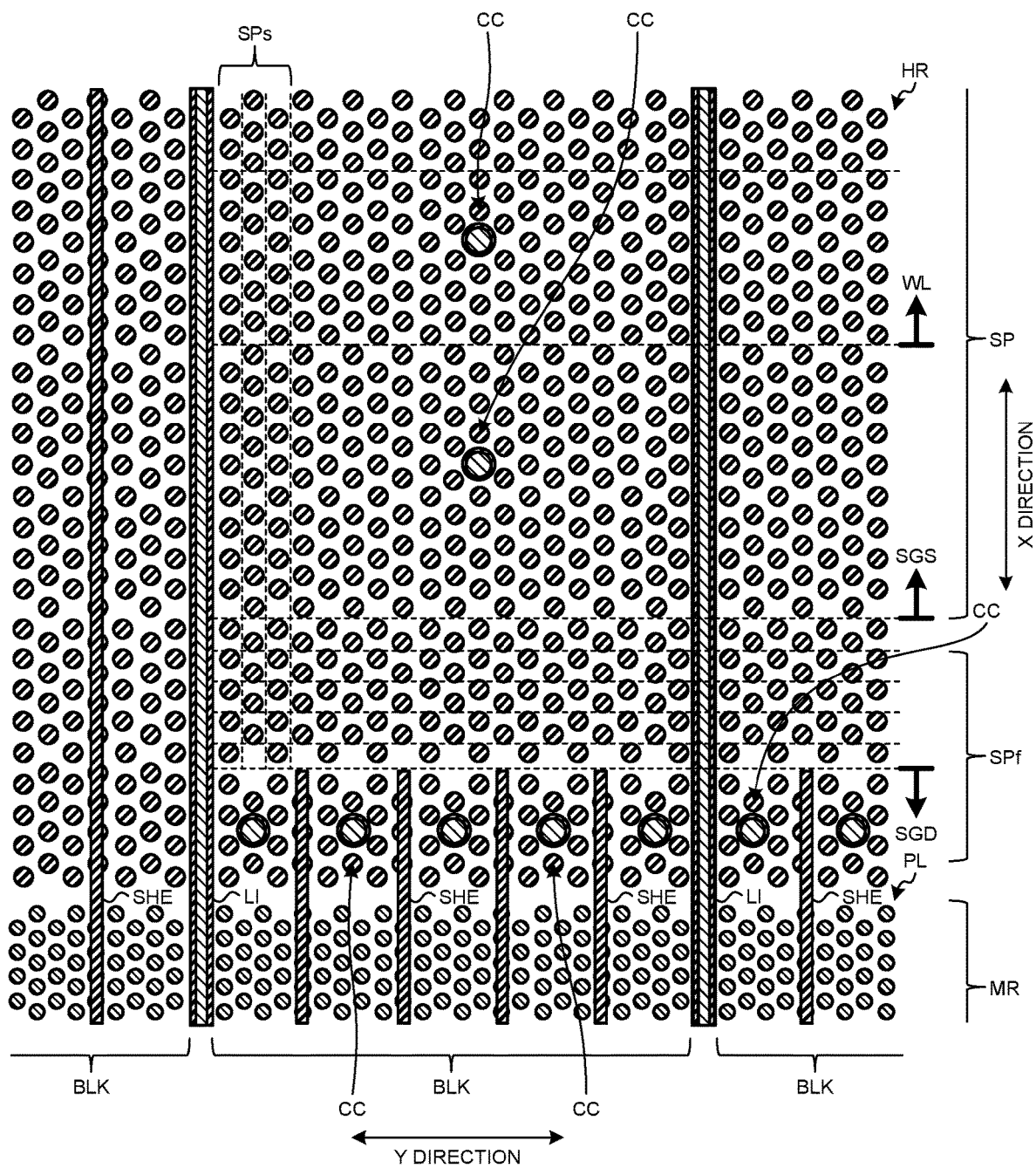
FIG. 3 is a top view including a stepped region of the semiconductor memory device according to the embodiment.

Next, the arrangement of the respective components in the stepped region SR is illustrated in FIG. 3. FIG. 3 is a top view including the stepped region SR of the semiconductor memory device 1 according to the embodiment. However, in FIG. 3, some components such as the insulating layers 51 to 54, the plugs V0 and CH, the bit line BL, and the upper layer wiring MX are omitted. Note that a plurality of broken lines illustrated in the stepped portions SP and SPf represent the respective steps of the stepped portions SP and SPf.

As illustrated in FIG. 3, the plurality of plate contacts LI is aligned in the Y direction and extends in the stacked body LM in the X direction from the memory region MR to the stepped region SR. A region of the stacked body LM obtained by division using the plurality of plate contacts LI is also referred to as a block region BLK.

In the block region BLK, the select gate line SGD is further separated by a plurality of isolation layers SHE. The isolation layer SHE is an insulating layer such as a silicon oxide layer that penetrates through the select gate lines SGD and reaches the insulating layer OL immediately below the select gate line SGD.

The isolation layer SHE extends in the X direction in the stacked body LM from the memory region MR to the uppermost step of the stepped portion SPf, that is, the stepped part formed by the select gate line SGD. Also on the stepped portion SP side facing the stepped portion SPf in the X direction, the isolation layer SHE extends in the stacked body LM in the X direction from the stepped part formed by the select gate line SGD which is the uppermost step of the stepped portion SP to the memory region MR positioned further away in the X direction.

In other words, since the isolation layer SHE penetrates through one or more conductive layers including the uppermost conductive layer of the stacked body LM and extends in the X direction in the stacked body LM, these conductive layers are separated into sections of a plurality of select gate lines SGD.

In the stepped part of the stepped portion SPf formed by the select gate line SGD, the contact CC connected to the select gate line SGD is disposed in each region isolated by the isolation layer SHE. In addition, the contact CC connected to the select gate line SGS or the word line WL is disposed in each block region BLK obtained by division using the plate contacts LI in the stepped part of the stepped portion SP formed by the select gate line SGS and the word line WL.

In addition, as described above, the contact CC connected to the select gate line SGD is disposed in each region isolated by the isolation layer SHE, in the stepped part of the stepped portion SP formed by the select gate line SGD, that is, at a position (not illustrated) above the upper side of FIG. 3. As described above, as the contacts CC are disposed in both the stepped portions SP and SPf for the select gate line SGD further divided into a plurality of regions in the block region BLK, a predetermined voltage can be applied to the individual select gates STD in the memory regions MR on both sides in the X direction.

The columnar portions HR are dispersedly arranged over the entire stepped region SR including the stepped portions SP, SPf, and SPs. The cross-sectional areas of the columnar portions HR in the direction along the XY plane are larger than, for example, the cross-sectional area of the pillar PL in the direction along the XY plane at the same height position of the stacked body LM. In addition, a pitch between the plurality of columnar portions HR is larger than, for example, a pitch between the plurality of pillars PL, and arrangement densities of the columnar portions HR per unit area of the word line WL in the stacked body LM is lower than an arrangement density of the pillars PL per unit area of the word line WL.

As described above, for example, as the pillars PL have a smaller cross-sectional area and a smaller pitch than those of the columnar portions HR, a large number of memory cells MC can be formed at high density in the stacked body LM having a predetermined size, and the storage capacity of the semiconductor memory device 1 can be increased. In addition, the columnar portions HR are only used to support the stacked body LM and thus do not have a precise configuration with a small cross-sectional area and a small pitch unlike the pillars PL, for example, as a result of which the manufacturing load can be reduced.

(Method for Manufacturing Semiconductor Memory Device)

Next, a method for manufacturing the semiconductor memory device 1 according to the embodiment will be described with reference to FIGS. 4A to 14C. FIGS. 4A to 14C are views sequentially illustrating a part of a procedure of the method for manufacturing the semiconductor memory device 1 according to the embodiment. Note that it is assumed that the peripheral circuit CUA has been formed on the substrate SB and the insulating layer 50 covering the peripheral circuit CUA has been formed before the processings illustrated in FIGS. 4A to 14C.

Figure 4A:
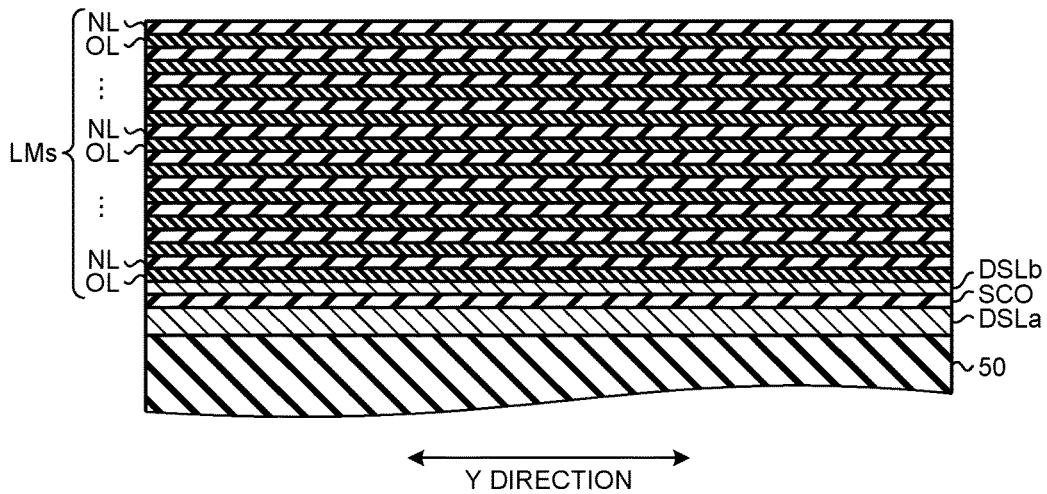
FIGS. 4A to 4C are views sequentially illustrating a part of a procedure of a method for manufacturing the semiconductor memory device according to the embodiment.
Figure 4B:
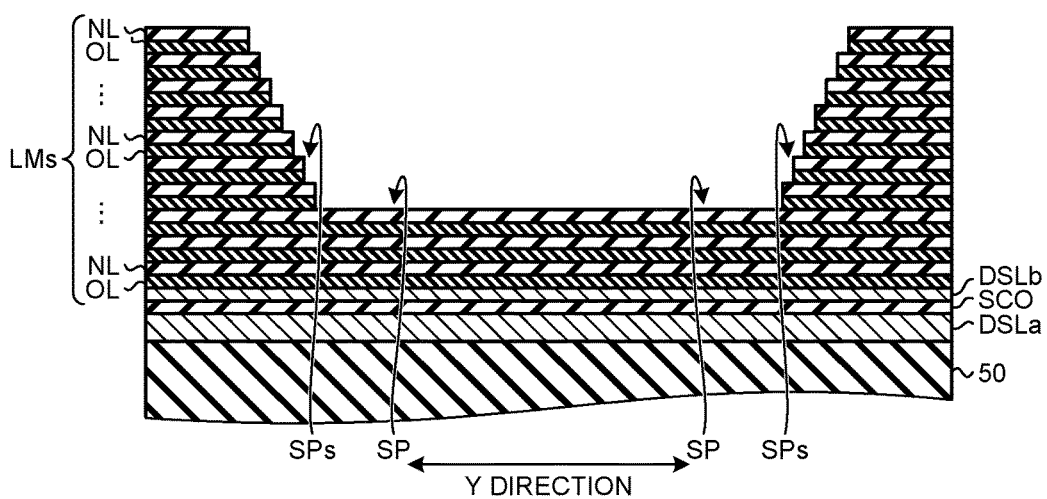
Figure 4C:
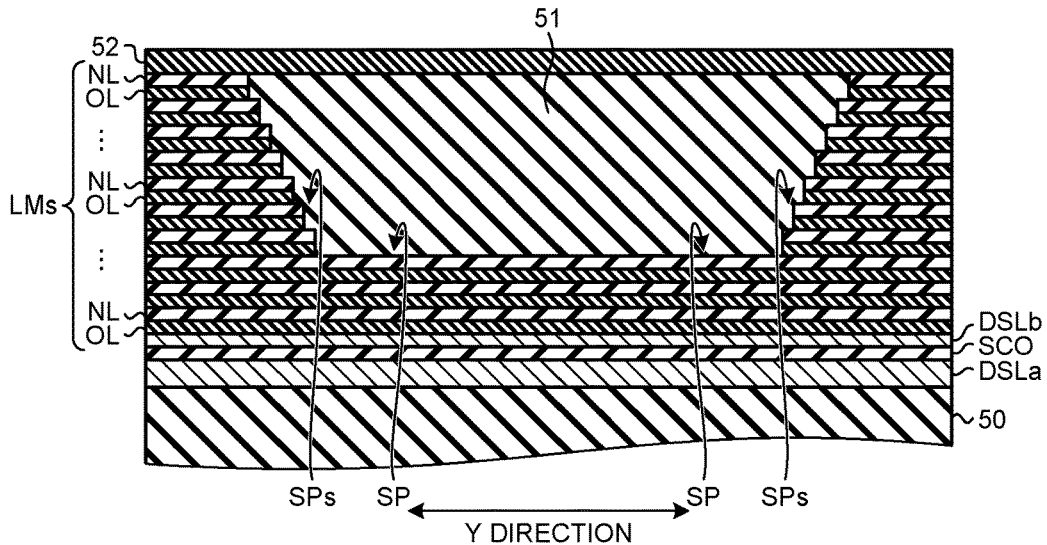

First, FIGS. 4A to 4C illustrate how the stepped portion SP is formed. FIGS. 4A to 4C illustrate a cross-section, of a region to be the stepped region SR later, in the Y direction.

As illustrated in FIG. 4A, the lower source line DSLa, the intermediate insulating layer SCO, and the upper source line DSLb are formed in this order on the insulating layer 50. The intermediate insulating layer SCO is, for example, a silicon oxide layer or the like.

In addition, a stacked body LMs in which a plurality of insulating layers NL and a plurality of insulating layers OL are alternately stacked one by one is formed above the upper source line DSLb. The insulating layers NL are, for example, silicon nitride layers or the like, and function as sacrificial layers that are later replaced with a conductive material and become the word lines WL and the select gate lines SGD and SGS.

As illustrated in FIG. 4B, in a partial region of the stacked body LMs, the insulating layer NL and the insulating layer OL are dug down in a stepped shape to form the stepped portion SP. The stepped portion SP is formed by repeating slimming of a mask pattern such as a photoresist layer and etching of the insulating layer NL and the insulating layer OL of the stacked body LMs multiple times.

That is, a mask pattern having an opening corresponding to a position where the stepped portion SP is to be formed is formed on the upper surface of the stacked body LMs, and for example, the insulating layer NL and the insulating layer OL are etched away one by one. By processing using oxygen plasma or the like, an end portion of the opening of a mask pattern is retracted to widen the opening, and the insulating layer NL and the insulating layer OL are further etched away one by one. The insulating layer NL and the insulating layer OL in the opening of the mask pattern are dug down in a stepped shape by repeating such processing multiple times.

Further, every time the above processing is repeated a predetermined number of times, the mask pattern is newly formed again so that the thickness of the mask pattern that is equal to or more than a predetermined value is maintained. At this time, the stepped portion SP that is relatively gently inclined and the steep dummy stepped portions SPf and SPs are formed by adjusting the position of the opening of the mask pattern. Similarly, by adjusting the positions of the end portions of the mask pattern at the both end portions of the stacked body LMs in the X direction and the both end portions of the stacked body LMs in the Y direction, steep dummy stepped portions are formed at the four end portions of the stacked body LMs, respectively, similarly to the stepped portions SPf and SPs.

FIG. 4B is a cross-sectional view of the third step from the lowermost step of the stepped portion SP formed in this manner. The cross section illustrated in FIG. 4B will be separated into two stepped portions SP by the plate contact LI to be formed later. The stepped portion SPs is formed on one side of the stacked body LMs of each stepped portion SP in the Y direction.

As illustrated in FIG. 4C, the insulating layer 51 such as a silicon oxide layer covering the stepped portion SP and reaching the height of the upper surface of the stacked body LMs is formed. That is, the insulating layer 51 is formed in a mortar-shaped region surrounded by the stepped portions SP, SPs, and SPf. At this time, an insulating layer (not illustrated) such as a silicon nitride layer is formed along the stepped shape of the insulating layers NL in the stepped portion SP, and the insulating layer 51 is formed in the stepped region SR via the insulating layer.

In addition, the insulating layer 51 is also formed in a peripheral region of the stacked body LMs having four end portions at which dummy stepped portions are formed, respectively. The insulating layer 52 covering the upper surface of the stacked body LMs and the upper surface of the insulating layer 51 is further formed on the upper surfaces of these layers.

Next, FIGS. 5A to 8Bc illustrate how the pillars PL and the columnar portions HR are formed. Similarly to FIGS. 4A to 4C, FIGS. 5A to 5C illustrate a cross section, of a region including the stepped portion SP, along the Y direction.

Figure 5A:
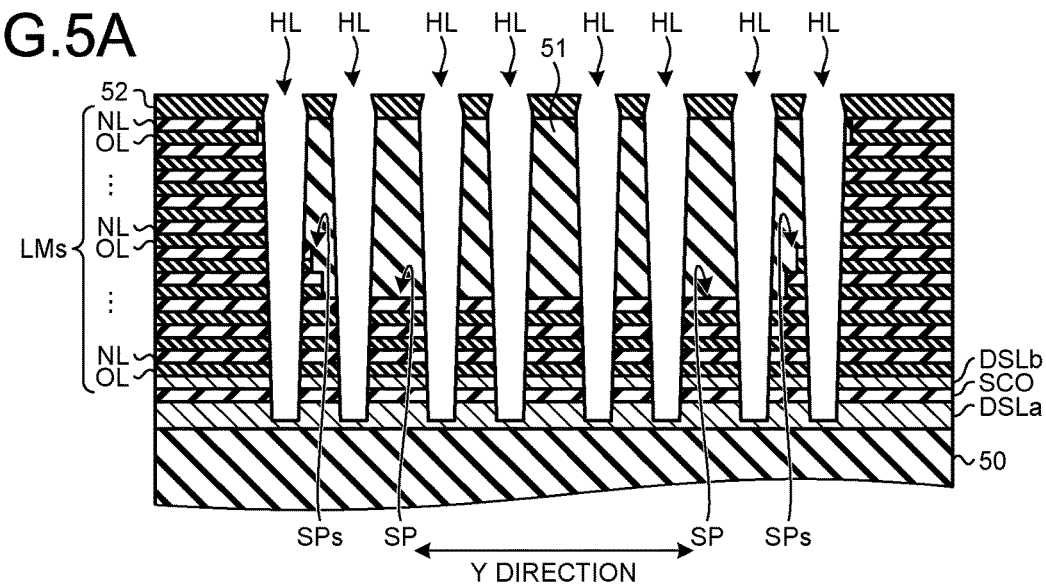
FIGS. 5A to 5C are views sequentially illustrating a part of the procedure of the method for manufacturing the semiconductor memory device according to the embodiment.

As illustrated in FIG. 5A, a plurality of holes HL penetrating through the insulating layers 52 and 51, the stacked body LMs, the upper source line DSLb, and the intermediate insulating layer SCO and reaching the lower source line DSLa are formed in the mortar-shaped region surrounded by the stepped portions SP, SPs, and SPf.

Figure 5B:
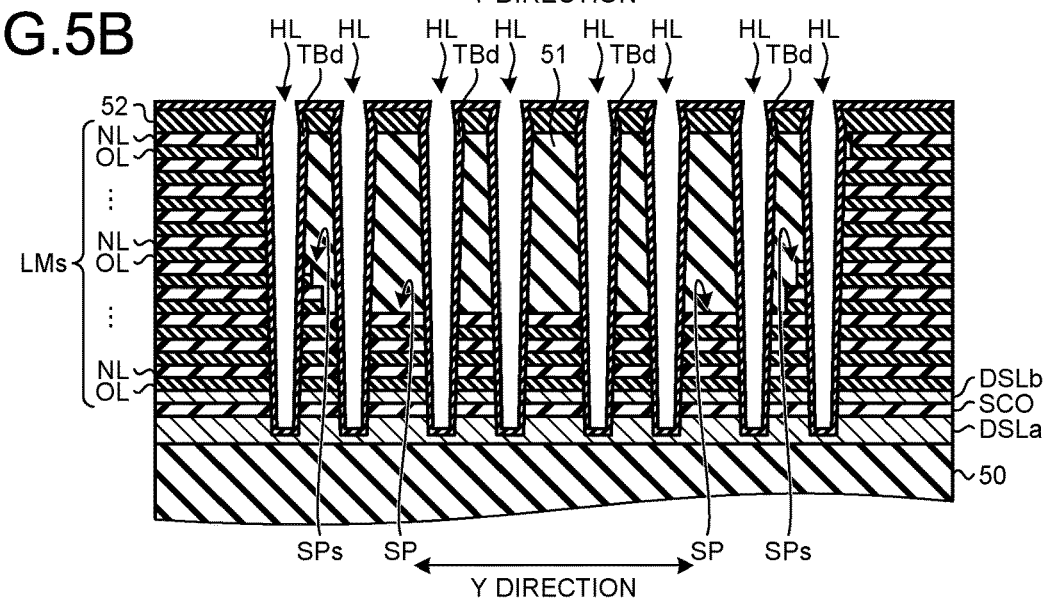

As illustrated in FIG. 5B, the dummy layer TBd is formed in the holes HL. At this time, the dummy layer TBd is also formed on the upper surface of the insulating layer 52. As described above, the dummy layer TBd includes the dummy layers BKd and TNd such as silicon oxide layers, and a layer corresponding to the charge accumulation layer CT of the pillar PL is not included between the dummy layers BKd and TNd.

Figure 5C:
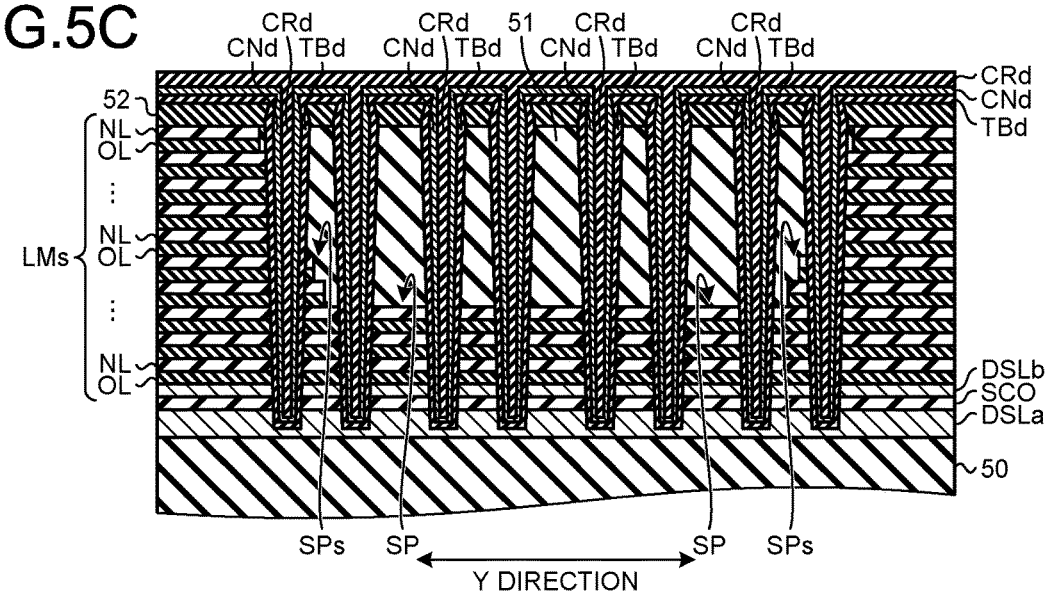

As illustrated in FIG. 5C, the dummy layer CNd is formed on the inner side of the dummy layer TBd in the hole HL. The dummy layer CNd is also formed above the upper surface of the insulating layer 52 while having the dummy layer TBd interposed therebetween. As described above, the dummy layer CNd is a semiconductor layer such as a polysilicon layer or amorphous silicon layer.

In addition, the dummy layer CRd such as a silicon oxide layer fills the inner side of the dummy layer CNd in the hole HL. The dummy layer CRd is also formed above the upper surface of the insulating layer 52 while having the dummy layers TBd and CNd interposed therebetween.

FIGS. 6A to 6C illustrate a cross section, of a region to be the memory region MR later, along the Y direction. However, the pillar PL has a circular shape, an elliptical shape, an oval shape, or the like as described above, and thus, the pillar PL has a similar cross-sectional shape regardless of the direction of the cross section.

As illustrated in FIG. 6A, in a region where the memory region MR is to be formed, the stacked body LMs is formed above the lower source line DSLa, an intermediate sacrificial layer SCN, and the upper source line DSLb, and the insulating layer 52 is formed on the stacked body LMs. The intermediate sacrificial layer SCN includes a silicon nitride layer or the like, and is later replaced with a conductive polysilicon layer or the like to become the intermediate source line BSL. In this state, a plurality of memory holes MH penetrating through the insulating layer 52 and the stacked body LMs and reaching the lower source line DSLa is formed.

As illustrated in FIG. 6B, in the memory hole MH, the memory layer ME in which the block insulating layer BK, the charge accumulation layer CT, and the tunnel insulating layer TN are stacked in order from the outer peripheral side of the memory hole MH is formed. The memory layer ME is also formed on the upper surface of the insulating layer 52. As described above, the block insulating layer BK and the tunnel insulating layer TN are, for example, silicon oxide layers or the like, and the charge accumulation layer CT is, for example, a silicon nitride layer or the like.

As illustrated in FIG. 6C, the channel layer CN such as a polysilicon layer or an amorphous silicon layer is formed on the inner side of the memory layer ME. The channel layer CN is also formed above the upper surface of the insulating layer 52 while having the memory layer ME interposed therebetween.

Further, the core layer CR such as a silicon oxide layer fills the further inner side of the channel layer CN. The core layer CR is also formed above the upper surface of the insulating layer 52 while having the memory layer ME and the channel layer CN interposed therebetween.

Note that the processing order of the above-described processings of FIGS. 5A to 6C can be changed. That is, the processings of FIGS. 6A to 6C may be performed prior to the processings of FIGS. 5A to 5C.

In addition, among the processings illustrated in FIGS. 5A to 6C, processings other than the processing of forming the dummy layer TBd in the hole HL and the processing of forming the memory layer ME in the memory hole MH may be performed in parallel.

That is, the processing of forming the hole HL in the stepped portion SP and the processing of forming the memory hole MH in the memory region MR can be performed in parallel. In addition, the processing of forming the dummy layers CNd and CRd in the hole HL and the processing of forming the channel layer CN and the core layer CR in the memory hole MH can be performed in parallel.

When forming the dummy layer TBd in the hole HL, the memory hole MH can be closed with a mask layer or the like, and when forming the memory layer ME in the memory hole MH, the hole HL can be closed with a mask layer or the like.

FIGS. 7Aa to 8Bc illustrate a cross section of both of a region to be the memory region MR later and a region including the stepped portion SP, along the Y direction. That is, Aa to Ac in FIGS. 7Aa to 8Bc are cross-sectional views, of the region to be the memory region MR later, along the Y direction, and Ba to Bc in FIGS. 7Aa to 8Bc illustrate processings corresponding to Aa to Ac in FIGS. 7Aa to 8Bc for the cross section, of the region including the stepped portion SP, along the Y direction.

As illustrated in FIG. 7Aa, the core layer CR on the upper surface of the insulating layer 52 and in the memory hole MH is etched back. At this time, a portion of the core layer CR in the memory hole MH is recessed by etching the core layer CR while taking a selectivity with respect to the channel layer CN using the underlying channel layer CN as a stopper layer, as a result of which a recess DN is formed at the upper end portion of the memory hole MH. Further, the core layer CR on the upper surface of the insulating layer 52 is removed to expose the channel layer CN.

As illustrated in FIG. 7Ab, the channel layer CN on the upper surface of the insulating layer 52 and in the memory hole MH is etched back. At this time, by etching the channel layer CN while taking a selectivity with respect to the memory layer ME using the underlying memory layer ME as a stopper layer, a portion of the channel layer CN in the memory hole MH retracts downward, and the recess DN at the upper end portion of the memory hole MH is expanded. The upper end portion of the core layer CR protrudes at the central portion of the recess DN. In addition, the channel layer CN on the upper surface of the insulating layer 52 is removed to expose the memory layer ME.

As illustrated in FIG. 7Ac, the memory layer ME on the upper surface of the insulating layer 52 and in the memory hole MH is etched back. At this time, the etching amount is adjusted so that the underlying insulating layer 52 is not removed. As a result, a portion of the memory layer ME in the memory hole MH retracts downward, and the recess DN at the upper end portion of the memory hole MH is further expanded. The upper end portion of the core layer CR protruding at the central portion of the recess DN is also removed, so that the bottom surface of the recess DN becomes substantially flat. In addition, the memory layer ME on the insulating layer 52 is removed to expose the insulating layer 52.

The processings of FIGS. 7Aa to 7Ac are controlled so that the bottom surface of the recess DN remains at the height position in the insulating layer 52 and does not reach the uppermost insulating layer NL after the processing of FIG. 7Ac.

As illustrated in FIG. 7Ba, the dummy layer CRd on the upper surface of the insulating layer 52 and in the hole HL is etched back by the processing of FIG. 7Aa for the memory hole MH, as a result of which a recess DNr is formed at the upper end portion of the hole HL. Further, the dummy layer CRd on the upper surface of the insulating layer 52 is removed to expose the dummy layer CNd.

As illustrated in FIG. 7Bb, the dummy layer CNd on the upper surface of the insulating layer 52 and in the hole HL is etched back by the processing of FIG. 7Ab for the memory hole MH, as a result of which the recess DNr at the upper end portion of the hole HL is expanded. The upper end portion of the dummy layer CRd protrudes at the central portion of the recess DNr. In addition, the dummy layer CNd on the upper surface of the insulating layer 52 is removed to expose the dummy layer TBd.

As illustrated in FIG. 7Bc, the dummy layer TBd on the upper surface of the insulating layer 52 and in the hole HL is etched back by the processing of FIG. 7Ac for the memory hole MH, as a result of which the recess DNr at the upper end portion of the hole HL is further expanded. The upper end portion of the dummy layer CRd protruding at the central portion of the recess DNr is also removed, so that the bottom surface of the recess DNr becomes substantially flat. Furthermore, the dummy layer TBd on the insulating layer 52 is removed to expose the insulating layer 52.

As illustrated in FIGS. 8Aa and 8Ba, the inner portions of the recesses DN and DNr are filled with a polysilicon layer, an amorphous silicon layer, or the like to form the cap layer CP and the dummy layer CPd, respectively.

As illustrated in FIGS. 8Ab and 8Bb, the insulating layer 52 is etched back together with the upper surface of each of the cap layer CP and the dummy layer CPd. As a result, the thicknesses of the insulating layer 52, the cap layer CP, and the dummy layer CPd are reduced.

As illustrated in FIGS. 8Ac and 8Bc, the thickness of the insulating layer 52 reduced by etching-back is increased by additionally stacking the insulating layer 52. As a result, the upper surfaces of the cap layer CP and the dummy layer CPd are covered with the insulating layer 52.

The plurality of pillars PL and the plurality of columnar portions HR are formed as described above. However, at this stage, the channel layer CN of the pillar PL is entirely covered with the memory layer ME, and is not connected to the intermediate sacrificial layer SCN to be the intermediate source line BSL later.

Note that the columnar portion HR is a dummy component that does not contribute to the function of the semiconductor memory device 1. Therefore, the columnar portion HR does not have to include the dummy layer CPd, and the processings of FIGS. 8Ba to 8Bc do not have to be performed on the columnar portion HR. In this case, the recess DNr of the columnar portion HR can be backfilled with, for example, the insulating layer 52 or the like.

Next, FIGS. 9A to 11Bb illustrate how the intermediate source line BSL and the word line WL are formed.

Similarly to FIGS. 8Aa to 8Ac and the like, FIGS. 9A to 10C illustrate a cross section, of a region to be the memory region MR later, along the Y direction.

As illustrated in FIG. 9A, a slit ST that penetrates through the insulating layer 52, the stacked body LMs, and the upper source line DSLb and reaches the intermediate sacrificial layer SCN is formed. The slit ST also extends in the X direction in the stacked body LMs.

As illustrated in FIG. 9B, an insulating layer 55p is formed on the side walls of the slit ST facing each other in the Y direction.

In parallel with the processings of FIGS. 9A and 9B, a contact hole to be the through contact C4 later and a slit to be the plate portion BR later may be formed in the through contact region TP.

That is, when forming the slit ST in FIG. 9A, a contact hole that penetrates through the insulating layer 52, the stacked body LMs, and the source line SL and reaches the insulating layer 50 is formed. In addition, a slit that penetrates through the insulating layer 52, the stacked body LMs, and the upper source line DSLb and reaches the intermediate insulating layer SCO is formed so as to sandwich the contact hole from the both sides in the Y direction.

Further, when forming the insulating layer 55p on the side walls of the slit ST in FIG. 9B, an insulating layer is formed on the side walls and the bottom surfaces of the contact hole and the slit. Thereafter, a sacrificial layer such as an amorphous silicon layer fills the further inner side of the insulating layer in the contact hole, and the contact hole is protected so as not to be affected by subsequent processing.

As illustrated in FIG. 9C, a removing liquid for the intermediate sacrificial layer SCN such as a hot phosphoric acid is caused to flow through the slit ST whose side walls are protected by the insulating layer 55p, and the intermediate sacrificial layer SCN sandwiched between the lower source line DSLa and the upper source line DSLb is removed.

As a result, a gap layer GPs is formed between the lower source line DSLa and the upper source line DSLb. Further, a part of the memory layer ME in the outer peripheral portion of the pillar PL is exposed in the gap layer GPs. At this time, since the side walls of the slit ST are protected by the insulating layer 55p, removal of the insulating layer NL in the stacked body LMs is also suppressed.

As illustrated in FIG. 10A, a chemical liquid is appropriately caused to flow into the gap layer GPs through the slit ST to sequentially remove the block insulating layer BK, the charge accumulation layer CT, and the tunnel insulating layer TN exposed in the gap layer GPs. As a result, the memory layer ME is removed from a part of the side wall of the pillar PL, and a part of the channel layer CN on the inner side is exposed in the gap layer GPs.

As illustrated in FIG. 10B, for example, a source gas such as amorphous silicon is injected from the slit ST whose side walls are protected by the insulating layer 55p to fill the gap layer GPs with the amorphous silicon or the like. In addition, the substrate SB is subjected to heat treatment to polycrystallize the amorphous silicon filling the gap layer GPs, thereby forming the intermediate source line BSL containing polysilicon or the like.

As a result, a part of the channel layer CN of the pillar PL is connected to the source line SL at the side wall via the intermediate source line BSL.

As illustrated in FIG. 10C, the insulating layer 55p on the side walls of the slit ST is removed once.

It is preferable that columnar portion HR that is a dummy component does not have electrical conduction with the source line SL. As described above, in the regions where the columnar portions HR are disposed such as the stepped region SR and the through contact region TP excluding the memory region MR, the intermediate sacrificial layer SCN is not disposed between the lower source line DSLa and the upper source line DSLb, and the intermediate insulating layer SCO is disposed between the lower source line DSLa and the upper source line DSLb. Therefore, in the processings of FIGS. 9A to 10C, in the stepped region SR, the through contact region TP, and the like, the removal of the intermediate sacrificial layer SCN, the removal of the dummy layer TBd, the formation of the intermediate source line BSL, and the like are not performed.

FIGS. 11Aa to 11Bb illustrate a cross section, of a region to be the memory region MR later, along the Y direction and a cross section, of a region to be the through contact region TP later, along the Y direction. That is, FIGS. 11Aa and 11Ab are cross-sectional views, of the region to be the memory region MR later, along the Y direction, similarly to FIGS. 9A to 10C and the like described above. FIGS. 11Ba and 11Bb illustrate processings corresponding to FIGS.

11Aa and 11Ab, respectively, for the cross section, of the region to be the through contact region TP later, along the Y direction.

As illustrated in FIG. 11Aa, for example, a removing liquid for the insulating layers NL such as a hot phosphoric acid is caused to flow into the stacked body LMs from the slit ST from which the insulating layer 55p on the side walls thereof has been removed to remove the insulating layers NL of the stacked body LMs. As a result, a stacked body LMg including a plurality of gap layers GP obtained by removing the insulating layers NL between the insulating layers OL is formed.

As illustrated in FIG. 11Ba, in the region to be the through contact region TP later, the insulating layer 57 is formed on the side wall and the bottom surface, and a contact hole C4s in which the inner side of the insulating layer 57 is filled with a sacrificial layer 23s is formed. In addition, slits BRs each having the side walls and the bottom surface on which an insulating layer 58 is formed are formed so as to sandwich the contact hole C4s from the both sides in the Y direction.

Also in the through contact region TP in such a state, the insulating layers NL are removed by the above processing in the memory region MR, as a result of which the stacked body LMg including a plurality of gap layers GP is formed. However, since a region where the contact hole C4s is formed is shielded by the slits BRs sandwiching the region from the both sides in the Y direction, the removing liquid for the insulating layers NL does not flow into the region. Therefore, in this region, the insulating layers NL between the insulating layers OL are maintained.

Note that the stacked body LMg including the plurality of gap layers GP has a fragile structure. In the memory region MR, the plurality of pillars PL supports such a fragile stacked body LMg. In the through contact region TP, the plurality of columnar portions HR supports the stacked body LMg. The plurality of columnar portions HR supports the stacked body LMg also in the stepped region SR and stepped portions at the both end portions of the stacked body LMg in the X direction and the both end portions of the stacked body LMg in the Y direction.

Such a support structure of the pillars PL and the columnar portions HR suppresses bending of the remaining insulating layers OL and distortion and collapse of the stacked body LMg.

As illustrated in FIGS. 11Ab and 11Bb, a source gas of a conductive material such as tungsten or molybdenum is injected from the slit ST into the stacked body LMg, and the gap layers GP of the stacked body LMg are filled with the conductive material to form the plurality of word lines WL. As a result, the stacked body LM in which the plurality of word lines WL and the plurality of insulating layers OL are alternately stacked one by one is formed. In addition, the select gate line SGS is formed below the lowermost word line WL while having the insulating layer OL interposed therebetween.

However, in the region where the insulating layers NL remain, the word line WL and the like are not formed, and the insulating portion NR in which the plurality of insulating layers NL and the plurality of insulating layers OL are alternately stacked is formed.

As described above, the processing of forming the intermediate source line BSL from the intermediate sacrificial layer SCN and the processing of forming the word line WL from the insulating layer NL are also referred to as replacement processing.

In the replacement processing of forming the word line WL and the like, after the insulating layer NL of the stacked body LMs is removed through the slit ST, a layer containing a metal oxide such as aluminum oxide may be formed on the inner wall of the gap layer GP prior to filling the gap layer GP with the conductive material. In this case, layers containing a metal oxide are formed on the upper and lower surfaces of the insulating layer OL in the stacking direction of the stacked body LM. In addition, a layer containing a barrier metal such as titanium, titanium nitride, tantalum, or tantalum nitride may be further interposed between such a layer containing a metal oxide and the conductive material such as tungsten or molybdenum to suppress diffusion of tungsten, molybdenum, or the like into other layers.

Here, in FIGS. 11Ab and 11Bb, a conductive layer 24 is formed above the uppermost word line WL while having the insulating layer OL interposed therebetween. The conductive layer 24 is patterned into the select gate lines SGD by forming the isolation layer SHE described below.

FIGS. 12A to 12C illustrate how the isolation layer SHE is formed. FIGS. 12A to 12C illustrate a cross section, along the Y direction, of the memory region MR different from the cross sections shown in FIGS. 11Aa, 11Ab, and the like.

As illustrated in FIG. 12A, in the processing so far, the plurality of pillars PL is formed in the memory region MR at a predetermined period.

As illustrated in FIG. 12B, a groove TR penetrating through the insulating layer 52 and the conductive layer 24 that becomes the select gate line SGD and extending substantially in the X direction in the stacked body LM is formed. Here, since the semiconductor memory device 1 of the embodiment includes only one select gate line SGD, the groove TR penetrates through the conductive layer 24 corresponding to the uppermost layer and reaches the insulating layer OL immediately below the conductive layer 24.

In addition, in the example illustrated in FIG. 12B, the groove TR is formed immediately above one pillar PL among the plurality of pillars PL arranged at a predetermined period. This is because the pillars PL may be arranged also at positions where the isolation layer SHE is formed such that the predetermined period at which the pillar PL are arranged is maintained when forming the plurality of pillars PL.

In this case, the upper structure of the pillar PL disappears by the groove TR, and an effective memory cell MC is not formed in such a pillar PL. Therefore, the pillar PL in which the groove TR is formed becomes a dummy pillar PLd that does not contribute to the function of the semiconductor memory device 1.

As illustrated in FIG. 12C, the groove TR is filled with an insulating layer 59 such as a silicon oxide layer. As a result, the isolation layer SHE is formed, so that the conductive layer 24 above the word line WL is patterned into the select gate line SGD.

Figure 13:
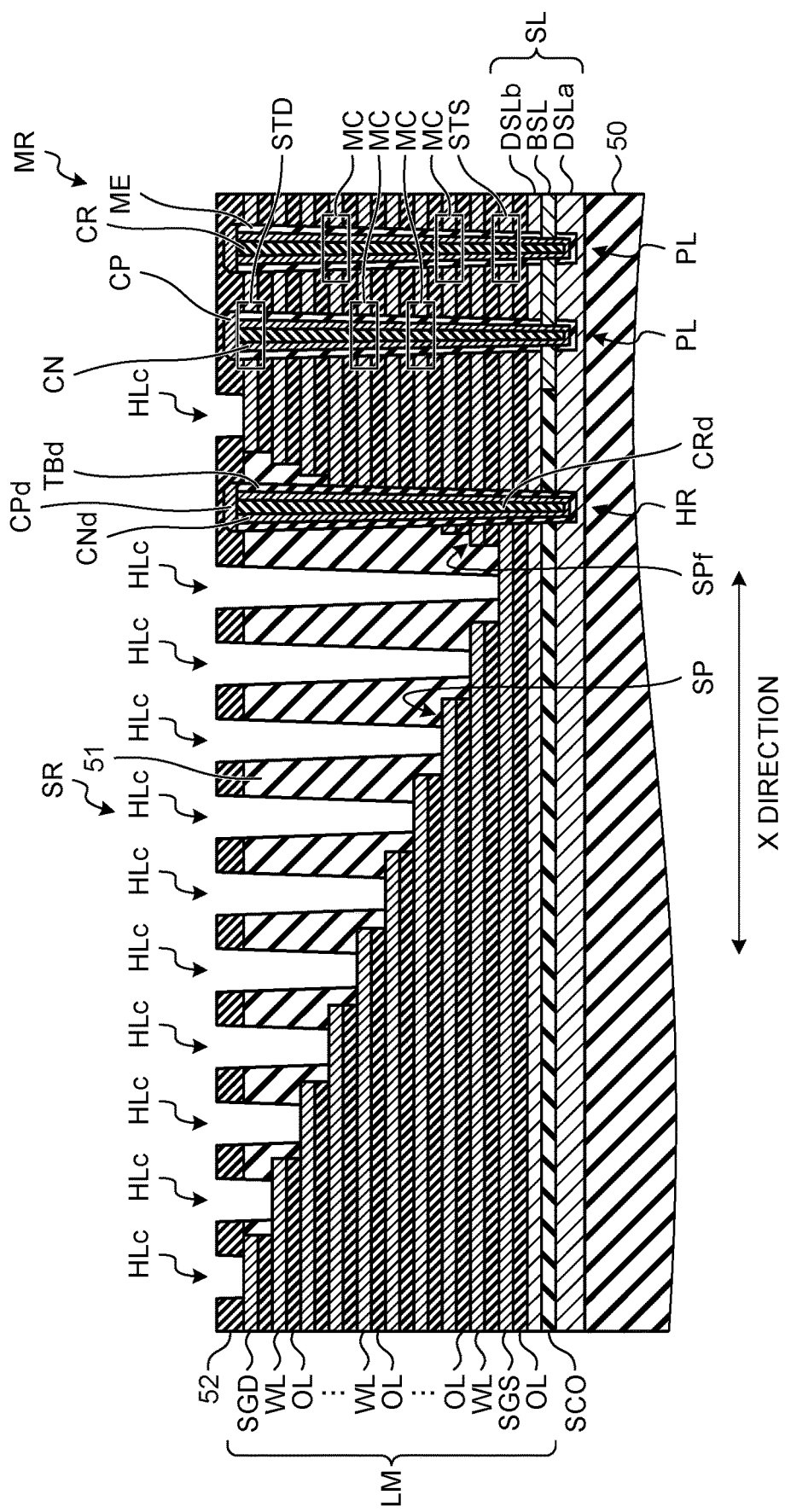
FIG. 13 is a view sequentially illustrating a part of the procedure of the method for manufacturing the semiconductor memory device according to the embodiment.
Figure 14A:
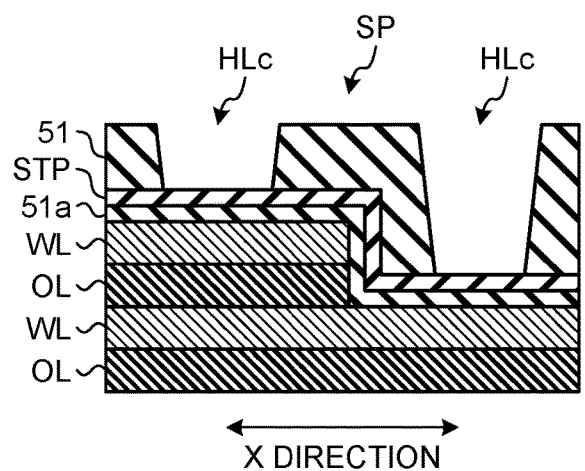
FIGS. 14A to 14C are views sequentially illustrating a part of the procedure of the method for manufacturing the semiconductor memory device according to the embodiment.
Figure 14B:
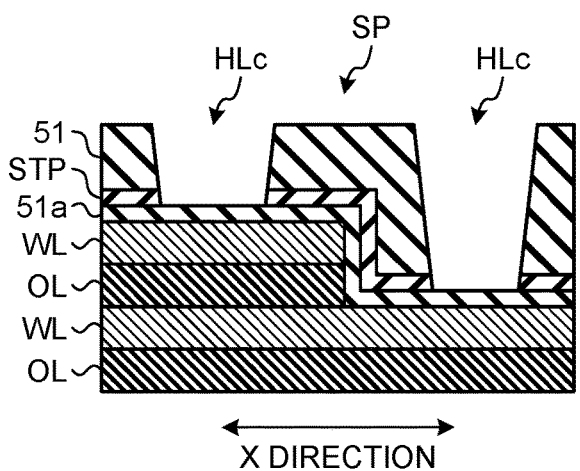
Figure 14C:
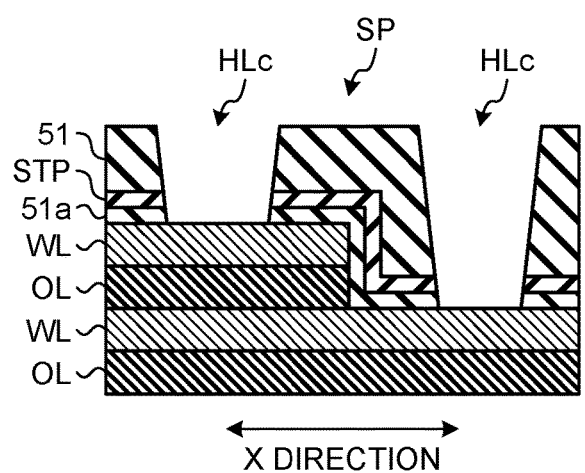

Next, FIGS. 13 to 14C illustrate how the contact CC is formed. FIG. 13 is a cross-sectional view along the X direction including the memory region MR and the stepped region SR, and corresponds to FIG. 2A. FIGS. 14A to 14C are partially enlarged cross-sectional views, of the stepped portion SP, along the X direction.

As illustrated in FIG. 13, a plurality of contact holes HLc penetrating through the insulating layers 52 and 51 and reaching the word lines WL and the select gate lines SGD and SGS constituting the respective steps of the stepped portion SP is formed. In addition, a contact hole HLc that penetrates through the insulating layer 52 and reaches the select gate line SGD constituting the uppermost step of the stepped portion SPf is formed.

The plurality of contact holes HLc is collectively formed, for example. However, the contact holes HLc have different depths. Therefore, as described above, an insulating layer such as a silicon nitride layer covering the stepped portions SP and SPf is formed in advance in the stepped portions SP and SPf. Hereinafter, as illustrated in FIGS. 14A to 14C, the plurality of contact holes HLc is formed while using the insulating layer as a stopper layer.

As illustrated in FIG. 14A, for example, the upper surface and the side surface of the word line WL of each step of the stepped portion SP are covered with a stopper layer STP serving as a seventh insulating layer while having an insulating layer 51a such as a silicon oxide layer interposed therebetween. The above-described insulating layer 51 is formed on the stepped portion SP while having the insulating layer 51a and the stopper layer STP interposed therebetween.

However, the stopper layer STP is disposed so as to avoid the position at which the above-described slit ST is formed, and is not in contact with the slit ST. Accordingly, at the time of replacement with the word line WL, for example, even the stopper layer STP, which is a silicon nitride layer or the like, is prevented from being replaced with a conductive layer.

When forming the plurality of contact holes HLc in the stepped portion SP, an etching condition that has a selectivity with respect to the stopper layer STP which is a silicon nitride layer or the like to enable selective removal of the insulating layers 52 and 51 which are silicon oxide layers or the like. As a result, when the bottom surfaces of the plurality of contact holes HLc reach the stopper layer STP at different depths, the etching of the contact holes HLc can be temporarily stopped.

As illustrated in FIG. 14B, etching for the stopper layer STP is then performed. As a result, the lower end portions of the plurality of contact holes HLc penetrate through the stopper layer STP at different depth positions and reach the insulating layer 51a below the stopper layer STP.

As illustrated in FIG. 14C, thereafter, the bottom surface of each contact hole HLc is caused to reach the corresponding word line WL by using an etching condition that has a selectivity with respect to the word line WL such as a tungsten layer or the like to enable selective removal of the insulating layer 51a.

As a result, for example, it is possible to form the plurality of contact holes HLc having different reaching depths while suppressing penetration through the word line WL to be connected. However, the processing of removing the stopper layer STP in FIG. 14B and the processing of removing the insulating layer 51a in FIG. 14C may be collectively performed. In this case, for example, an etching condition that has a selectivity with respect to the word line WL to enable removal of both the stopper layer STP and the insulating layer 51a can be used.

Thereafter, the insulating layer 56 (see FIG. 2A) covering the side wall of the contact hole HLc is formed, and the conductive layer 22 (see FIG. 2A) fills the further inner side of the insulating layer 56. As a result, a plurality of contacts CC connected to the plurality of word lines WL and the select gate lines SGD and SGS are formed.

After the contacts CC are formed in the stepped portions SP and SPf or before the contacts CC are formed, the through contact C4 is formed in the through contact region TP. That is, the sacrificial layer 23s in the contact hole C4s and the insulating layer 57 on the bottom surface of the contact hole C4s are removed, and the conductive layer 23 (see FIG. 2B) fills the inner side of the insulating layer 57 on the side wall of the contact hole C4s. As a result, the through contact C4 connected to the peripheral circuit CUA via the lower layer wiring D2 in the insulating layer 50 is formed.

In addition, the insulating layer 55 is formed on the side walls of the slit ST at a timing before forming the through contact C4 or at the time of forming the through contact C4, and the inner side of the insulating layer 55 is filled with the conductive layer 21 to form the plate contact LI to be the source line contact. However, the insulating layer 55 and the like may fill the slit ST without forming the conductive layer 21, and a plate member not having a function as the source line contact may be formed.

In addition, the insulating layer 53 is formed on the insulating layer 52, and the plug V0 penetrating through the insulating layer 53 and connected to each of the plate contact LI, the through contact C4, and the contact CC is formed. In addition, the plug CH penetrating through the insulating layers 53 and 52 and connected to the pillar PL is formed. Furthermore, the insulating layer 54 is formed on the insulating layer 53, and the upper layer wiring MX, the bit line BL, and the like connected to the plugs V0 and CH, respectively, are formed.

For example, the plugs V0 and CH, the upper layer wiring MX, the bit line BL, and the like may be collectively formed by using a dual damascene method or the like.

The semiconductor memory device 1 of the embodiment is manufactured as described above.

In a process of manufacturing a semiconductor memory device such as a three-dimensional nonvolatile memory, a stacked body in which conductive layers and insulating layers are stacked may be formed by replacing sacrificial layers in the stacked body with the conductive layers. In this case, in order to support the fragile stacked body including a plurality of gap layers during replacement, for example, columnar portions may be arranged in the stepped region or the like. The columnar portion has, for example, a structure in which an insulating layer such as a silicon oxide layer fills a hole penetrating through the stacked body.

However, in a case where the columnar portion is formed of an insulating layer or the like, the insulating layer included in the columnar portion may shrink due to thermal treatment in a subsequent manufacturing process. In addition, due to the shrinkage of the plurality of columnar portions, the entire stepped region or the like in which these columnar portions are arranged may sink in a stacking direction of the stacked body as compared with other regions such as the memory region. That is, the upper surface of the semiconductor memory device in the middle of manufacturing has unevenness. The sinking due to the shrinkage of the columnar portions is more remarkable in the stepped region or the like thickly covered with a single insulating layer than in a through contact region or the like having a stacked structure.

When such sinking occurs, for example, the sinking region is not focused and proper exposure is not performed in some cases in processing using a lithography technology or the like. In addition, for example, in removal processing by polishing of a metal material filling a hole, a groove, or the like from the upper surface of the stacked body, a polishing residue of the metal material may be generated in a region where the sinking has occurred.

According to the semiconductor memory device 1 of the embodiment, the columnar portion HR includes the dummy layer CRd extending in the stacked body LM in the stacking direction of the stacked body LM, the dummy layer CNd covering the side wall of the dummy layer CRd, the dummy layer TNd covering the side wall of the dummy layer CNd, and the dummy layer BKd covering the side wall of the dummy layer TNd without interposing a layer corresponding to the charge accumulation layer CT.

As described above, the dummy layer CNd, which is a semiconductor layer, has a higher Young's modulus than an insulating layer such as a silicon oxide layer, for example, and has a property of being hard and hardly thermally shrunk. Since the columnar portion HR includes the dummy layer CNd, thermal shrinkage of the columnar portion HR can be suppressed, and the stepped region SR or the like in which the columnar portions HR are arranged can be suppressed from sinking with respect to other regions.

Further, even in a semiconductor layer having a high Young's modulus, for example, when the volume of the semiconductor layer increases, aggregation may occur by heat treatment. As the dummy layer CRd is disposed as the core material of the columnar portion HR and is covered with the thin dummy layer CNd, it is possible to suppress aggregation of the dummy layer CNd and to further suppress sinking of the stepped region SR.

In addition, when forming the slit ST, the slit ST and the columnar portion HR in the vicinity thereof may come into contact with each other due to positional displacement, an expansion in width of the slit ST, or the like. In a case where a silicon nitride layer or the like corresponding to the charge accumulation layer CT is included in the columnar portion HR, the silicon nitride layer of the columnar portion HR that is in contact with the slit ST may be exposed in the slit ST, and thus, there is a possibility that a part or the whole of the silicon nitride layer inside the columnar portion HR is replaced with a conductive layer via the exposed portion at the time of replacing the insulating layer NL with the word line WL. As a result, a conductive layer is formed at a position across the plurality of word lines WL inside the columnar portion HR, and thus, there is a possibility that a withstand voltage is insufficient between the plurality of word lines WL.

With the configuration in which the columnar portion HR not to include a layer corresponding to the charge accumulation layer CT, even in a case where the columnar portion HR comes into contact with the slit ST, it is possible to suppress the withstand voltage between the word lines WL from being insufficient and to suppress an influence on the electrical characteristics of the semiconductor memory device 1.

In addition, in a case where the slit ST and the columnar portion HR come into contact with each other and the dummy layer CNd of the columnar portion HR is exposed in the slit ST, the exposed surface of the dummy layer CNd can be oxidized by subsequent processing, and the insulating layer 55 is formed on the side walls of the slit ST after the replacement processing with the word line WL. Therefore, for example, electrical conduction between the dummy layer CNd exposed in the slit ST and the conductive layer 21 subsequently filling the slit ST is suppressed.

As described above, in the semiconductor memory device 1 of the embodiment, the structure of the columnar portion HR supporting the stacked body LM can be optimized.

First Modified Example

Next, a semiconductor memory device 2 according to a first modified example of the embodiment will be described with reference to FIGS. 15A to 17. The semiconductor memory device 2 of the first modified example is different from the above-described embodiment in that a columnar portion HRm having the same layer structure as that of the pillar PL is provided in addition to the above-described columnar portion HR. Hereinafter, the same reference signs are given to the same components as those of the above-described embodiment, and a description thereof may be omitted.

Figure 15A:
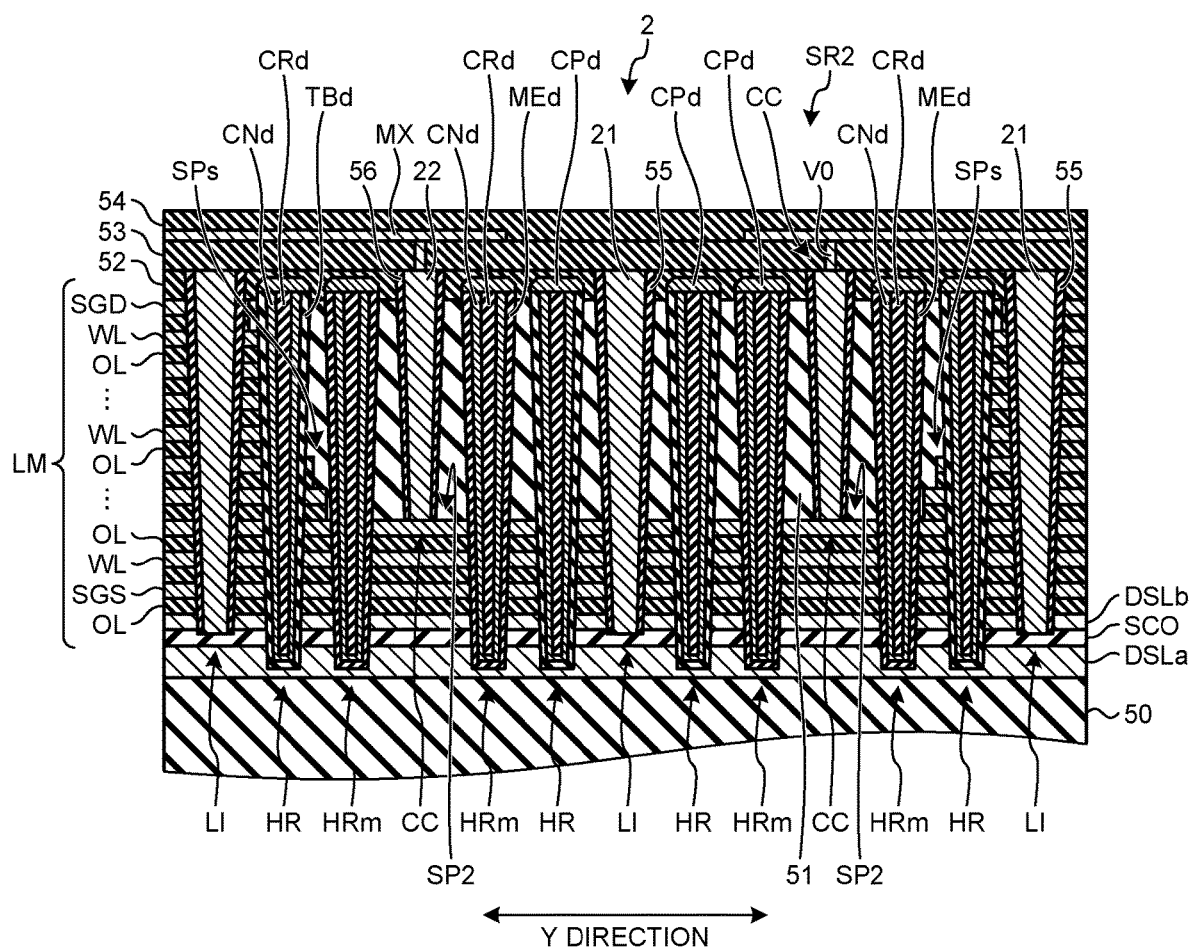
FIGS. 15A to 15C are cross-sectional views illustrating an example of a configuration of a stepped portion of a semiconductor memory device according to a first modified example of the embodiment.
Figure 15B:
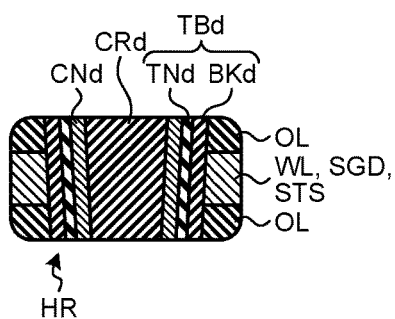
Figure 15C:
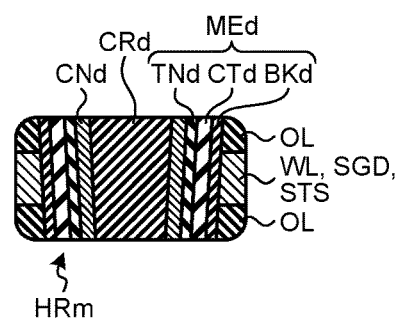

FIGS. 15A to 15C are cross-sectional views illustrating an example of a configuration of a stepped portion SP2 of the semiconductor memory device 2 according to the first modified example of the embodiment. FIG. 15A is a cross-sectional view, including a stepped region SR2, along the Y direction. FIG. 15B is a partially enlarged view illustrating a cross section of a columnar portion HR disposed in the stepped region SR2. FIG. 15C is a partially enlarged view illustrating a cross section of the columnar portion HRm disposed in the stepped region SR2.

As illustrated in FIG. 15A, two types of columnar portions HR and HRm having different layer structures are dispersedly arranged in the stepped region SR2 of the semiconductor memory device 2.

The columnar portions HR are arranged side by side in the X direction along a plate contact LI at least at positions adjacent to the plate contact LI in the Y direction. The columnar portions HR may be dispersedly arranged in the entire stepped region SR except for positions adjacent to a contact CC.

As illustrated in FIG. 15B, the columnar portion HR has the same configuration as that of the columnar portion HR included in the semiconductor memory device 1 of the embodiment described above. That is, FIG. 15B is the same as FIG. 2E of the above-described embodiment.

The columnar portions HRm serving as third pillars extend in a stacked body LM in a stacking direction of the stacked body LM, and are arranged at least at positions adjacent to the contact CC so as to surround the contact CC when viewed from the stacking direction of the stacked body LM. The columnar portions HRm may be dispersedly arranged in the entire stepped region SR except for the positions adjacent to the plate contact LI.

As illustrated in FIG. 15C, the columnar portion HRm has, for example, the same layer structure as that of the pillar PL. That is, the columnar portion HRm includes dummy layers CRd, CNd, MEd, and CPd.

The dummy layer CRd serving as a second insulating layer is a component corresponding to a core layer CR of the pillar PL, and is a silicon oxide layer (first oxide layer) or the like that penetrates through an insulating layer 51, the stacked body LM, an upper source line DSL, and an intermediate insulating layer SCO and reaches a lower source line DSLa.

The dummy layer CNd is a component corresponding to a channel layer CN of the pillar PL, and is a semiconductor layer such as a polysilicon layer or an amorphous silicon layer covering the side wall and the bottom surface of the dummy layer CRd.

The dummy layer MEd is a component corresponding to a memory layer ME of the pillar PL, and covers the side wall and the bottom surface of the dummy layer CNd. The dummy layer MEd also covers the side wall of the dummy layer CNd at a height position corresponding to the intermediate insulating layer SCO.

The dummy layer MEd has a stacked structure in which a dummy layer BKd serving as a fourth insulating layer, a dummy layer CTd serving as a fifth insulating layer, and a dummy layer TNd serving as a third insulating layer, which are corresponding to a block insulating layer BK, a charge accumulation layer CT, and a tunnel insulating layer TN of the pillar PL, respectively, are stacked in this order from the outer peripheral side of the columnar portion HRm. The dummy layers TNd and BKd are, for example, silicon oxide layers (second and third oxide layers) or the like, and the dummy layer CTd is, for example, a silicon nitride layer (first nitride layer) or the like.

A dummy layer CPd is a component corresponding to a cap layer CP of the pillar PL, and is a semiconductor layer such as a polysilicon layer or an amorphous silicon layer disposed in an insulating layer 52 at the upper end portion of the columnar portion HRm. However, the columnar portion HRm does not have to include the dummy layer CPd.

As described above, the columnar portion HRm is different from the columnar portion HR in that the columnar portion HRm includes the dummy layer CTd corresponding to the charge accumulation layer CT.

Figure 16:
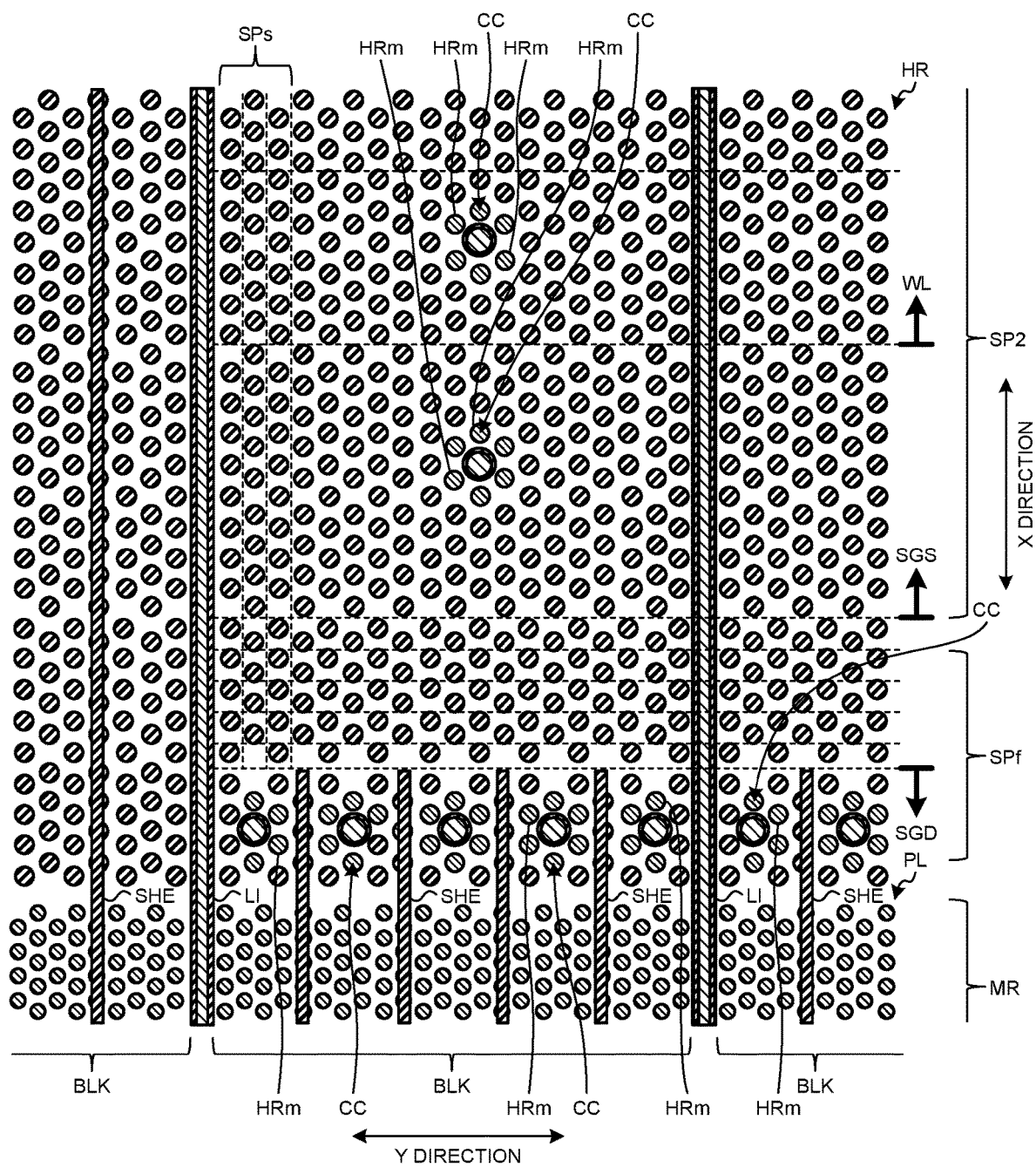
FIG. 16 is a top view including the stepped region of the semiconductor memory device according to the first modified example of the embodiment.

Next, the arrangement of the respective components in the stepped region SR2 is illustrated in FIG. 16. FIG. 16 is a top view including the stepped region SR2 of the semiconductor memory device 2 according to the first modified example of the embodiment. However, in FIG. 16, some components such as insulating layers 51 to 54, plugs V0 and CH, a bit line BL, and an upper layer wiring MX are omitted.

As illustrated in FIG. 16, the cross-sectional area of the columnar portion HRm in a direction along an XY plane is, for example, about the same as the cross-sectional area of the columnar portion HR in the direction along the XY plane. The plurality of columnar portions HR and HRm are arranged in the stepped region SR2 at a predetermined period as a whole while avoiding interference with the contact CC.

In the example of FIG. 16, the columnar portions HRm are arranged so as to surround the contact CC connected to word lines WL and select gate lines SGD and SGS. In addition, the columnar portions HR are arranged so as to surround the contact CC at more outward positions as compared with the columnar portions HRm. That is, the columnar portions HR are dispersedly arranged in the entire stepped region SR2 except for positions adjacent to the contact CC.

However, as described above, the columnar portions HR may be arranged along the plate contact LI exclusively at positions adjacent to the plate contact LI, and the columnar portions HRm may be dispersedly arranged in the entire stepped region SR2 at positions other than the positions adjacent to the plate contact LI.

Note that, also in a through contact region TP and dummy stepped portions at the both end portions of the stacked body LM in the X direction and the Y direction, the columnar portions HR and HRm may be arranged in these regions as long as the columnar portions HR are arranged at least in the vicinity of the plate contact LI. However, it is more convenient to dispersedly arrange only the columnar portions HR in the through contact region TP and the dummy stepped portions at the end portions of the stacked body LM without arranging the columnar portions HRm.

The configuration of the semiconductor memory device 2 of the first modified example as described above can be obtained, for example, by collectively forming the columnar portions HRm together with the pillars PL.

When forming a contact hole HLc in the stepped portion SP2, the contact hole HLc may come into contact with the columnar portion HRm in the vicinity of the contact hole HLc. There are several possible causes for the contact between the contact hole HLc and the columnar portion HRm as described below.

One of the causes is that at least one of the contact hole HLc when forming the contact CC or a hole HL (see FIG. 5A) when forming the columnar portion HRm is inclined with respect to a substrate SB, for example, due to oblique incidence of ions in plasma. Another cause is that, for example, distortion occurs in a stacked body LMg at the time of replacement with the word line WL, as a result of which the formed columnar portion HRm is inclined.

Still another cause is that the contact hole HLc when forming the contact CC is formed in a state of causing positional displacement with respect to the columnar portion HRm.

Figure 17:
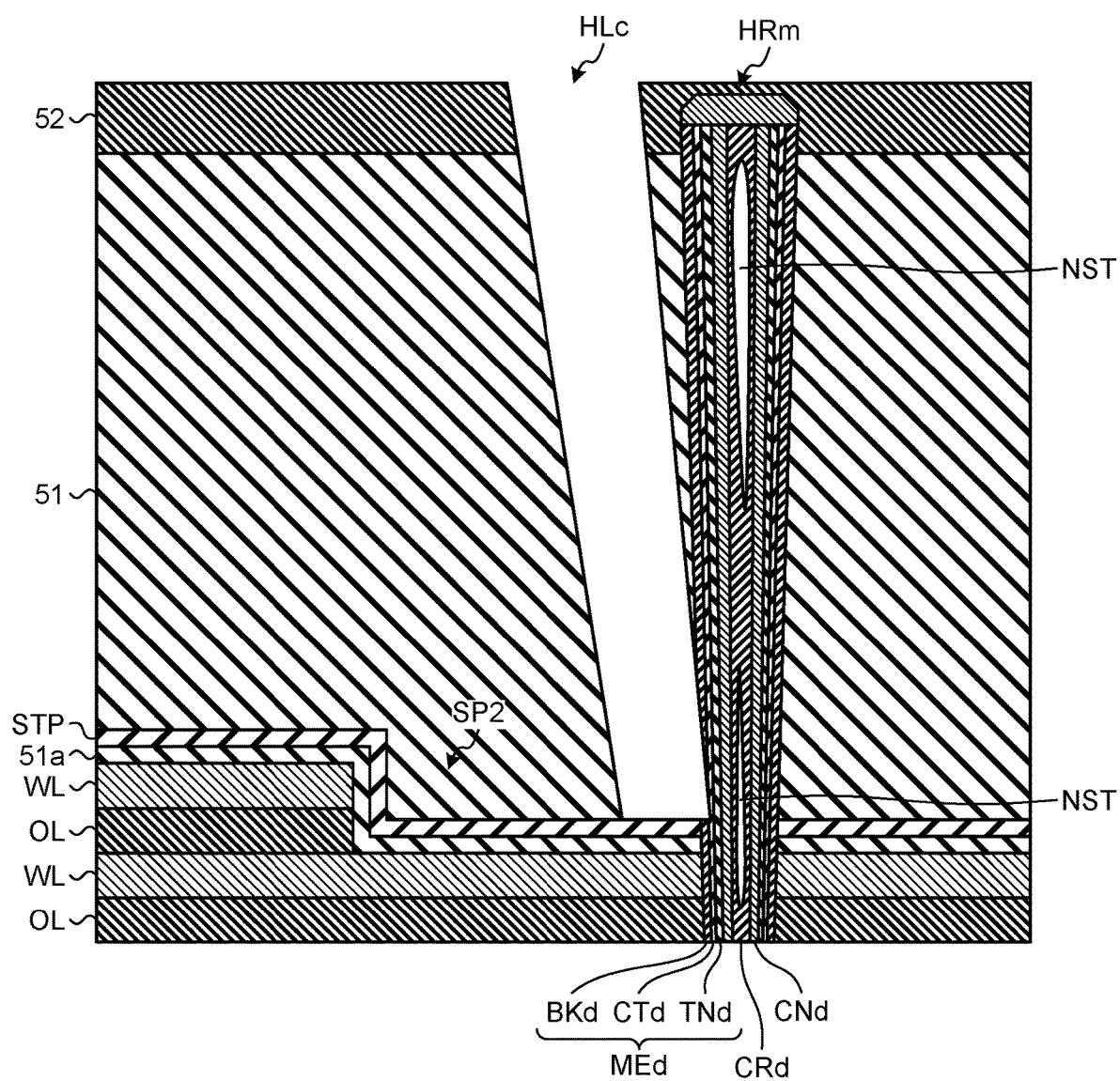
FIG. 17 is a cross-sectional view in an X direction illustrating how a contact hole is formed in the stepped portion of the semiconductor memory device according to the first modified example of the embodiment.

FIG. 17 illustrates an example in which the contact hole HLc and the columnar portion HRm are in contact with each other.

FIG. 17 is a cross-sectional view along the X direction illustrating how the contact hole HLc is formed in the stepped portion SP2 of the semiconductor memory device 2 according to the first modified example of the embodiment. In the example illustrated in FIG. 17, since the contact hole HLc is inclined, the lower end portion of the contact hole HLc is in contact with the columnar portion HRm.

In the example of FIG. 17, the columnar portion HRm has a cavity NST in the dummy layer CRd. Such a cavity NST can be formed by generating an unfilled portion when, for example, filling the hole HL with the dummy layer CRd serving as a core material of the columnar portions HR and HRm.

As described above, in a case where the columnar portion HRm has the cavity NST in the dummy layer CRd, if etching at the time of forming the contact hole HLc continues to proceed to the inside of the columnar portion HRm and reaches the cavity NST, there is a possibility that the cavity NST is also filled with a conductive layer 22 when the contact hole HLc is filled with the conductive layer 22.

However, at the time of forming the contact hole HLc, as described above, the insulating layer 51 serving as a fourth oxide layer is etched such that the lower end portion of the contact hole HLc remains on the stopper layer STP while initially taking a selectivity with respect to the stopper layer STP serving as a second nitride layer formed on the stepped portion SP2.

Therefore, although a portion of the dummy layer BKd in the outermost peripheral portion of the columnar portion HRm that is in contact with the contact hole HLc can be etched away, the dummy layer CTd inside the dummy layer BKd functions as an etch stopper layer and suppresses the etching from proceeding further into the columnar portion HRm.

Thereafter, when removing the stopper layer STP above the word line WL, the dummy layer CTd in the columnar portion HRm can also be removed, but at that time, the dummy layer TNd inside the dummy layer CTd functions as a stopper layer. In addition, when removing the insulating layer 51a on the upper surface of the word line WL, for example, even if the dummy layer TNd in the columnar portion HRm is removed, the dummy layer CNd further inside the columnar portion HRm functions as a stopper layer.

According to the semiconductor memory device 2 of the first modified example, the columnar portion HRm having the same layer structure as that of the pillar PL is disposed closer to the contact CC than the columnar portion HR is, and the stopper layer STP containing the same type of material as that of the dummy layer CTd of the columnar portion HRm is disposed above the plurality of word lines WL and the select gate lines SGD and SGS processed in a stepped shape.

As a result, even in a case where the contact hole HLc and the columnar portion HRm come into contact with each other, the etching is stopped by the dummy layer CTd, and it is possible to suppress the conductive layer 22 of the contact CC from filling the cavity NST in the dummy layer CRd. Therefore, for example, conduction between the contact CC and the columnar portion HRm or conduction between the contact CC and another word line WL via the columnar portion HRm is suppressed.

Even in a case where the stopper layer STP is not provided above the plurality of word lines WL and the select gate lines SGD and SGS processed in a stepped shape in the stepped portion SP2, the dummy layer CTd containing a material different from the insulating layer 51 is disposed in the columnar portion HRm, so that the dummy layer CTd can function as a stopper layer against the etching toward the inside of the columnar portion HRm at the time of forming the contact hole HLc.

According to the semiconductor memory device 2 of the first modified example, other effects similar to those of the above-described embodiment are obtained.

Second Modified Example

The columnar portion HRm of the above-described first modified example can be used in combination with a columnar portion that is a single insulating layer instead of the above-described columnar portion HR. In this case, a ratio between the columnar portion that is a single insulating layer and the above-described columnar portion HRm may be appropriately adjusted according to the degree of sinking in the stepped region SR2 or the like. That is, as the proportion of the columnar portion HRm in the stepped region SR2 is increased, the sinking of the stepped region SR2 and the like can be further suppressed.

In addition, in a case where the columnar portion that is single insulating layer and the above-described columnar portion HRm are used in combination, as described below, the process of manufacturing the semiconductor memory device can be simplified by using the columnar portion HRm whose diameter is increased with respect to the columnar portion that is a single insulating layer.

Hereinafter, a semiconductor memory device 3 of the second modified example of the embodiment will be described with reference to FIGS. 18 to 20C. The semiconductor memory device 3 of the second modified example is different from that of the first modified example described above in that the semiconductor memory device 3 includes a columnar portion HRk that is a single insulating layer. Hereinafter, the same reference signs are given to the same components as those of the above-described first modified example, and a description thereof may be omitted.

Figure 18:
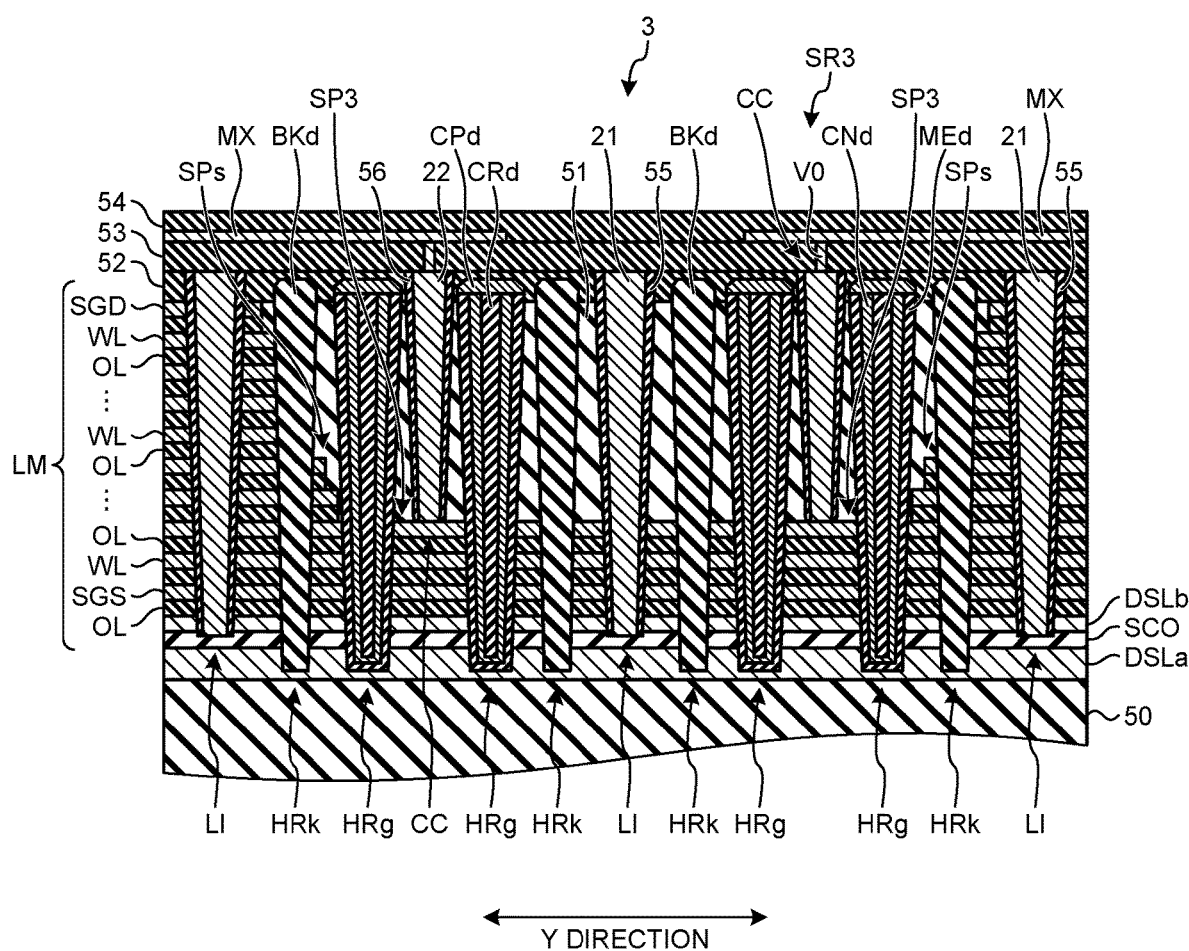
FIG. 18 is a cross-sectional view in a Y direction illustrating an example of a configuration of a stepped portion of a semiconductor memory device according to a second modified example of the embodiment.

FIG. 18 is a cross-sectional view along the Y direction illustrating an example of a configuration of a stepped portion SP3 of the semiconductor memory device 3 according to the second modified example of the embodiment.

As illustrated in FIG. 18, the semiconductor memory device 3 includes two types of columnar portions HRg and HRk having different sizes and layer structures in a stepped region SR3. The plurality of columnar portions HRg and HRk is arranged in the stepped region SR3 at a predetermined period as a whole while avoiding interference with a plate contact LI and a contact CC.

The columnar portion HRg serving as a third pillar has the same configuration as that of the columnar portion HRm included in the semiconductor memory device 2 of the first modified example described above. However, the cross-sectional area of the columnar portion HRg in a direction along an XY plane is larger than, for example, the cross-sectional area of the columnar portion HRm in the direction along the XY plane.

More specifically, the columnar portion HRg includes a dummy layer CRd serving as a first oxide layer extending in a stacking direction in an insulating layer 51 and a stacked body LM. In addition, the columnar portion HRg includes a dummy layer CNd which is a semiconductor layer or the like covering the side wall of the dummy layer CRd. In addition, the columnar portion HRg includes a dummy layer MEd covering the side wall of the dummy layer CNd.

The dummy layer MEd includes a dummy layer TNd serving as a second oxide layer, a dummy layer CTd serving as a first nitride layer covering the side wall of the dummy layer TNd, and a dummy layer BKd serving as a third oxide layer covering the side wall of the dummy layer CTd.

In addition, the columnar portion HRg may include a dummy layer CPd which is a semiconductor layer or the like.

The columnar portions HRg are arranged at least at positions adjacent to the contact CC so as to surround the contact CC when viewed from the stacking direction of the stacked body LM. At this time, in order to suppress sinking of the stepped region SR3, it is preferable that the columnar portions HRg are dispersedly arranged in the entire stepped region SR3 except for the positions adjacent to the plate contact LI.

The columnar portion HRk serving as a second pillar includes, for example, a single dummy layer BKd. The dummy layer BKd is a layer corresponding to a block insulating layer BK of a pillar PL, and is, for example, a silicon oxide layer or the like.

The cross-sectional area of the columnar portion HRk in the direction along the XY plane is, for example, smaller than the cross-sectional area of the columnar portion HRg in the direction along the XY plane, and is equal to or smaller than that of the columnar portion HR included in the semiconductor memory device 2 of the above-described first modified example.

The columnar portions HRk are arranged side by side in the X direction along the plate contact LI at least at positions adjacent to the plate contact LI in the Y direction. At this time, as described above, in order to suppress the sinking of the stepped region SR3, it is preferable that the positions where the columnar portions HRk that are easily thermally shrunk are arranged are limited to a region as small as possible in the vicinity of the plate contact LI.

Note that, in the semiconductor memory device 3 of the second modified example, the columnar portions HRg and HRk can also be arranged at a predetermined ratio in a through contact region TP and dummy stepped portions at end portions of the stacked body LM.

FIGS. 19A to 20C are views sequentially illustrating a part of a procedure of a method for manufacturing the semiconductor memory device 3 according to the second modified example of the embodiment. FIGS. 19A to 20C illustrate a cross section, including the stepped region SR3, along the Y direction, and correspond to the cross section of FIG. 18 described above. Hereinafter, an example of a method of forming the columnar portions HRg and HRk will be mainly described.

Figure 19A:
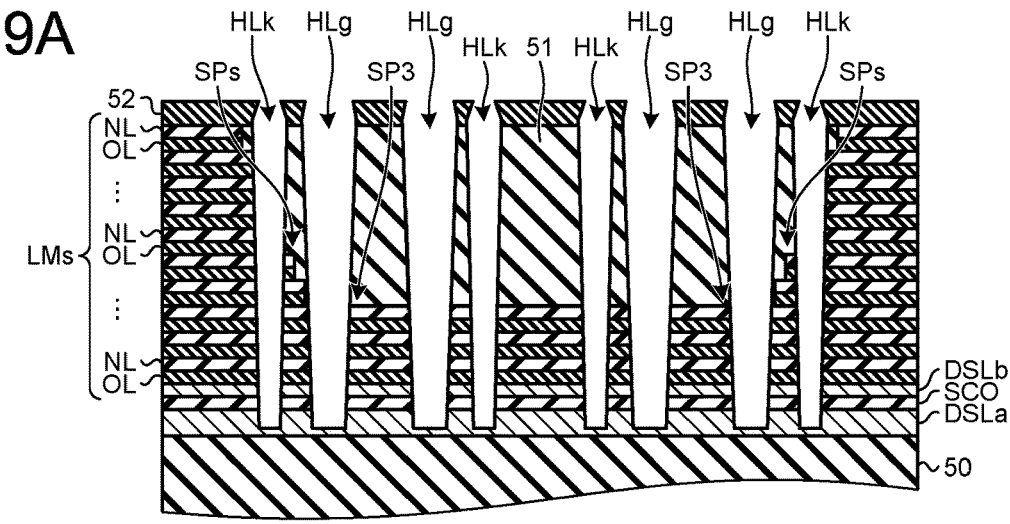
FIGS. 19A to 19C are views sequentially illustrating a part of a procedure of a method for manufacturing the semiconductor memory device according to the second modified example of the embodiment.

As illustrated in FIG. 19A, a plurality of holes HLg and HLk penetrating through an insulating layers 52 and 51, a stacked body LMs, an upper source line DSLb, and an intermediate insulating layer SCO and reaching a lower source line DSLa is formed. The hole HLg is formed to have a larger diameter than that of the hole HLk.

Figure 19B:
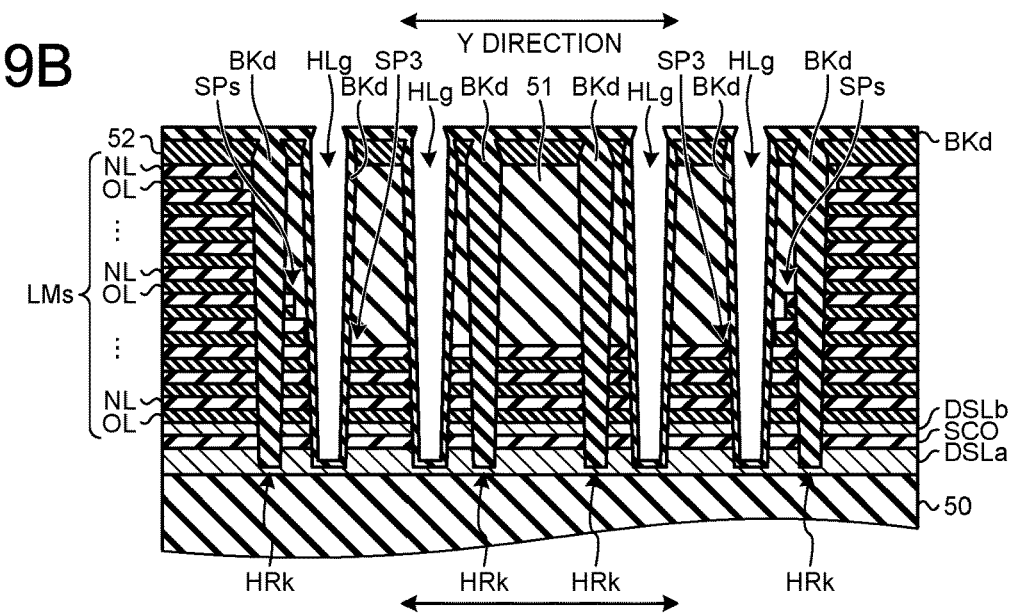

As illustrated in FIG. 19B, the dummy layer BKd is formed in the plurality of holes HLg and HLk. At this time, for example, after forming the dummy layer BKd having a thickness that is approximately the same as that of the block insulating layer BK in the pillar PL, the formation of the dummy layer BKd is further continued. In this way, due to a difference in size between the holes HLg and HLk, the dummy layer BKd covers the side wall and the bottom surface of the hole HLg and substantially completely fills the hole HLk. The columnar portion HRk is formed in this manner. The dummy layer BKd is also formed on the upper surface of the insulating layer 52.

Figure 19C:
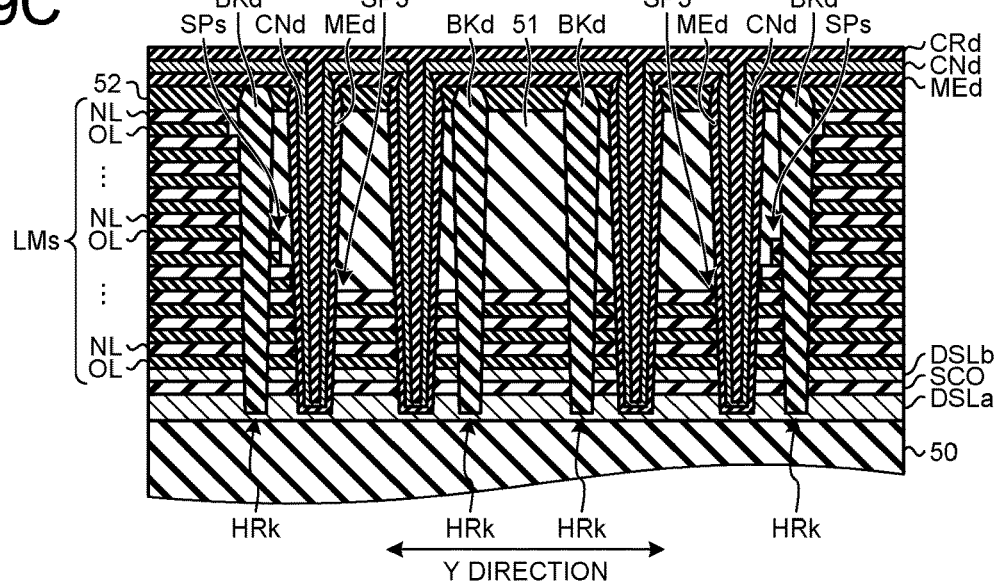
Figure 20:
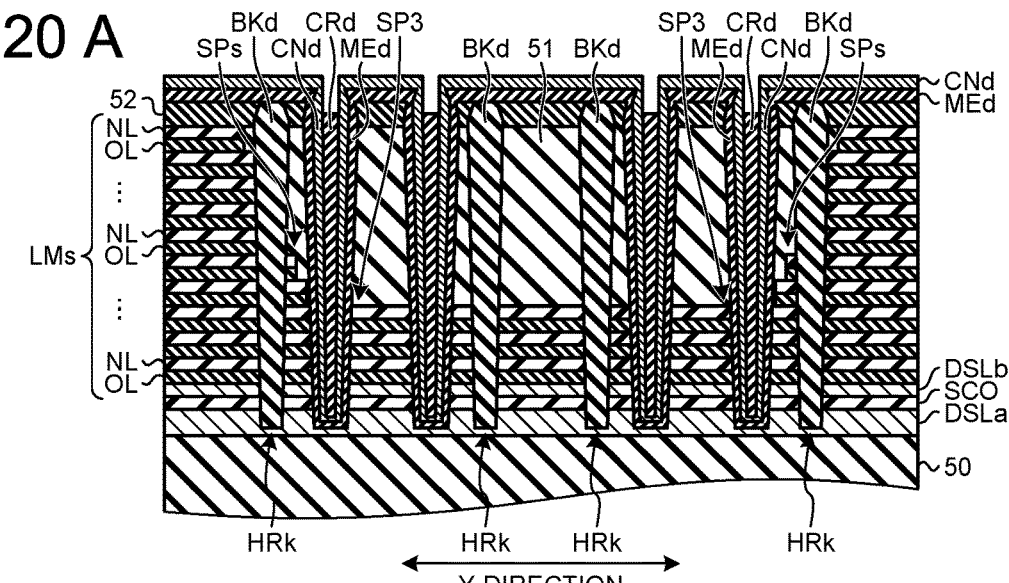
FIGS. 20A to 20C are views sequentially illustrating a part of the procedure of the method for manufacturing the semiconductor memory device according to the second modified example of the embodiment.
Figure 20:
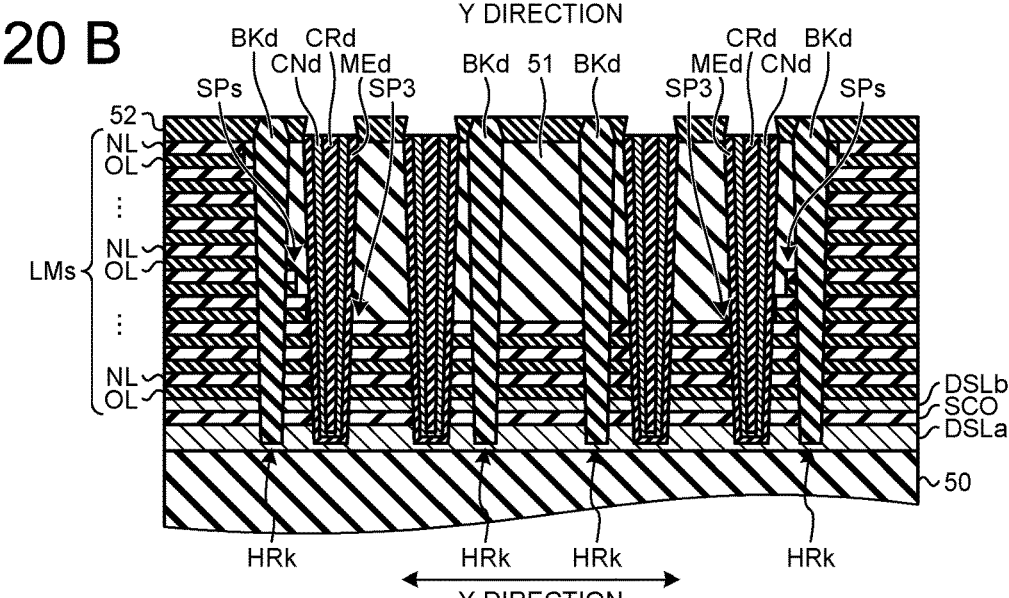
Figure 20:
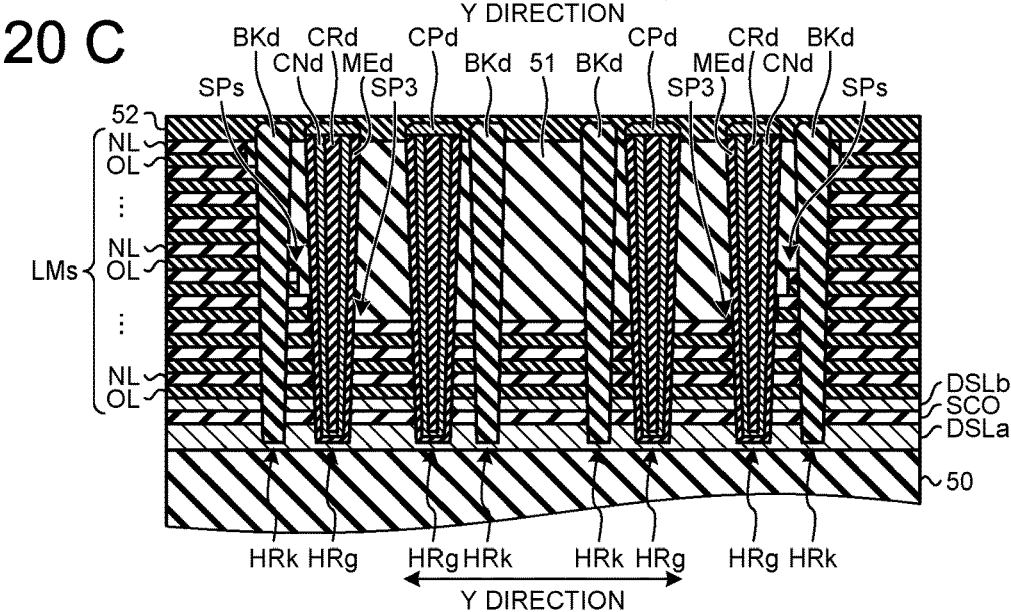

As illustrated in FIG. 19C, the dummy layer CTd and the dummy layer TNd are stacked in this order on the inner side of the dummy layer BKd in the hole HLg to form the dummy layer MEd, the dummy layer CNd is further formed, and the inner side of the dummy layer CNd is filled with the dummy layer CRd. The dummy layer MEd including the previously formed dummy layer BKd is also formed on the upper surface of the insulating layer 52. In addition, the dummy layer CNd is also formed on the upper surface of the insulating layer 52 while having the dummy layer MEd interposed therebetween, and the dummy layer CRd further covers the dummy layer CNd.

At this time, since the columnar portion HRk is already filled with the dummy layer BKd, the dummy layers CTd, TNd, CNd, and CRd are not formed in the hole HLk of the columnar portion HRk.

As illustrated in FIG. 20A, the dummy layer CRd on the upper surface of the insulating layer 52 and in the hole HLg is etched back to form a recess at the upper end portion of the hole HLg. The dummy layer CNd is exposed on the upper surface of the insulating layer 52. The dummy layer CRd is also removed from the upper surface of the columnar portion HRk.

As illustrated in FIG. 20B, the dummy layer CNd on the upper surface of the insulating layer 52 and in the hole HLg is etched back to expand the recess of the upper end portion of the hole HLg. The dummy layer MEd is exposed on the upper surface of the insulating layer 52. The dummy layer CNd is also removed from the upper surface of the columnar portion HRk.

In addition, the dummy layer MEd on the upper surface of the insulating layer 52 and in the hole HLg is etched back to further expand the recess of the upper end portion of the hole HLg. As a result, the dummy layer MEd is also removed from the upper surface of the insulating layer 52 to expose the upper surface of the columnar portion HRk.

As illustrated in FIG. 20C, the recess of the upper end portion of the hole HLg is filled with the dummy layer CPd, and the upper end portion of the dummy layer CPd is etched back together with the insulating layer 52. The columnar portion HRg is formed in this manner. Also in the above processing, the dummy layer CPd is not formed at the upper end portion of the columnar portion HRk. Thereafter, the etched-back insulating layer 52 is additionally stacked to cover the upper surfaces of the columnar portions HRg and HRk.

The columnar portions HRg and HRk of the second modified example are formed in this manner.

As described above, the diameter of the columnar portion HRg has a larger diameter that that of the columnar portion HRk, so that the columnar portions HRg and HRk can be collectively formed. Therefore, the columnar portions HRg and HRk having different layer structures can be densely formed at a predetermined period as a whole in the stepped region SR3 or the like.

In addition, in the processings illustrated in FIGS. 19A to 19C, when forming the block insulating layer BK of the pillar PL, a part of the processing of forming the dummy layer BKd in the holes HLg and HLk can be performed in parallel. After the block insulating layer BK having a desired thickness is formed in the memory hole MH, the memory hole MH is protected with a mask layer or the like, and as described above, the processing of forming the dummy layer BKd in the holes HLg and HLk is continued until the hole HLk is substantially completely filled.

Further, even after the dummy layer BKd is formed, processing of forming the charge accumulation layer CT, the tunnel insulating layer TN, the channel layer CN, the core layer CR, the cap layer CP in the pillar PL and the processing of forming the dummy layers CTd, TNd, CNd, CRd, and CPd in the columnar portion HRg can be performed in parallel. However, as in the above-described embodiment, the columnar portion HRg does not have to include the dummy layer CPd, and the processings of FIGS. 20A to 20C for the columnar portions HRg and HRk may be skipped.

Other methods for manufacturing the semiconductor memory device 3 are, for example, similar to the method for manufacturing the semiconductor memory device 1 of the above-described embodiment.

In the above example, the sizes of the columnar portions HRg and HRk are made different, and the columnar portions HRg and HRk are collectively formed. However, these columnar portions may be separately formed by making the size of a columnar portion that is a single insulating layer and the size of a columnar portion having the same layer structure as that of the pillar PL substantially the same as each other.

As described above, as in first and second modified examples, the columnar portions HRm and HRg each including an oxide layer extending in the stacking direction of the stacked body LM and a nitride layer extending in the stacking direction of the stacked body LM at a predetermined position in the oxide layer are arranged at least in the vicinity of the contact CC, so that it is possible to suppress sinking of the stacked body LM while allowing the columnar portions HRm and HRg to be in contact with the contact CC.

In addition, as in first and second modified examples, the columnar portions HR and HRk each including one or more oxide layers are arranged at least in the vicinity of the plate contact LI without including a nitride layer corresponding to the charge accumulation layer CT of the pillar PL, so that it is possible to allow the contact of the columnar portions HR and HRk to the plate contact LI.

Other Modified Examples

In the above-described embodiment and first and second modified examples, the stepped portions SP and SP2, and the like are disposed in the central portion of the stacked body LM while being sandwiched by the memory regions MR. However, for example, the contact CC may be disposed in a stepped portion on one side or the both sides in the X direction of the stacked body LM to have a function of drawing the word line WL or the like. Also in this case, the configurations of the columnar portions HR, HRm, HRg, and HRk and the like of the above-described embodiment and first and second modified examples can be applied.

In the above-described embodiment and first and second modified examples, the pillar PL is connected to the source line SL on the side surface of the channel layer CN, but is not limited thereto. For example, the pillar may be connected to the source line at the lower end portion of the channel layer by removing the memory layer on the bottom surface of the pillar.

In addition, in the above-described embodiment and first and second modified examples, the insulating layers NL and OL are alternately stacked to form the stacked body LMs. However, the stacked body LMs may be formed in a plurality of tiers, and in this case, the pillars PL, the columnar portions HR, HRm, HRg, and HRk, the stepped portions SP and SP2, and the like may be formed in stages every time the stacked body LMs for one tier is formed. As a result, the number of stacked word lines WL can be further increased.

In the above-described embodiment and first and second modified examples, the peripheral circuit CUA is disposed below the stacked body LM. However, the peripheral circuit CUA may be disposed above the stacked body LM or in the same hierarchy as the stacked body LM.

In a case where the peripheral circuit CUA is disposed above the stacked body LM, for example, the peripheral circuit CUA may be formed on a semiconductor substrate different from the substrate on which the stacked body LM is formed, and the semiconductor substrate on which the peripheral circuit CUA is formed may be bonded to the upper surface of the stacked body LM.

In a case where the peripheral circuit CUA is disposed in the same hierarchy as the stacked body LM, the stacked body LM can be formed on the semiconductor substrate on which the peripheral circuit CUA is formed. With this configuration, a polysilicon layer or the like may be formed as the source line on the semiconductor substrate, or impurities may be diffused into the surface layer of the semiconductor substrate, so that a part of the semiconductor substrate may be used as the source line. In this case, the semiconductor memory device does not have to include the through contact region TP.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a stacked body that includes a plurality of conductive layers and a plurality of first insulating layers alternately stacked one by one and includes a stepped portion in which the plurality of conductive layers is processed in a stepped shape;
   a first pillar that extends in a stacking direction of the stacked body in the stacked body away from the stepped portion in a first direction intersecting the stacking direction and forms a memory cell at each intersection with at least a part of the plurality of conductive layers; and
   a plurality of second pillars that extends in the stacking direction in the stacked body in the stepped portion, wherein
   each of the plurality of second pillars includes
   a second insulating layer extending in the stacked body in the stacking direction,
   a semiconductor layer covering a side wall of the second insulating layer,
   a third insulating layer disposed in contact with a side wall of the semiconductor layer and covering the side wall of the semiconductor layer, and
   a fourth insulating layer disposed in direct contact with a side wall of the third insulating layer and covering the side wall of the third insulating layer, and
   the third and fourth insulating layers contain a same kind of material.

2. The semiconductor memory device according to claim 1, further comprising
   a first plate member and a second plate member that extend in the stacking direction and the first direction in the stacked body at positions away from each other in a second direction intersecting the stacking direction and the first direction,
   wherein the plurality of second pillars is dispersedly arranged between the first and second plate members.

3. The semiconductor memory device according to claim 1, further comprising:
   a contact that is disposed in the stepped portion and connected to one of the plurality of conductive layers; and
   a plurality of third pillars that extends in the stacking direction in the stacked body in the stepped portion at positions closer to the contact than the plurality of second pillars is, wherein
   each of the plurality of third pillars includes
   the second insulating layer extending in the stacked body in the stacking direction,
   the semiconductor layer covering the side wall of the second insulating layer,
   the third insulating layer disposed in contact with the side wall of the semiconductor layer and covering the side wall of the semiconductor layer,
   a fifth insulating layer disposed in contact with the side wall of the third insulating layer and covering the side wall of the third insulating layer, and
   the fourth insulating layer disposed in contact with a side wall of the fifth insulating layer and covering the side wall of the fifth insulating layer, and
   the fifth insulating layer contains a different kind of material from that of the third and fourth insulating layers.

4. The semiconductor memory device according to claim 3, wherein
   the third and fourth insulating layers are oxide layers, and the fifth insulating layer is a nitride layer.

5. The semiconductor memory device according to claim 4, further comprising:
   a sixth insulating layer that covers upper sides of the plurality of conductive layers processed in the stepped shape in the stepped portion and has an upper surface that is substantially flush; and
   a seventh insulating layer that is disposed between the plurality of conductive layers and the sixth insulating layer along the stepped shape of the plurality of conductive layers in the stepped portion, contains a same kind of material as that of the fifth insulating layer, and is penetrated by the contact together with the sixth insulating layer.

6. The semiconductor memory device according to claim 3, wherein the plurality of third pillars surrounds the contact when viewed from the stacking direction.

7. The semiconductor memory device according to claim 6, further comprising
a first plate member and a second plate member that extend in the stacking direction and the first direction in the stacked body at positions away from each other in a second direction intersecting the stacking direction and the first direction, wherein
at least a part of the plurality of second pillars is arranged along the first and second plate members.

8. A semiconductor memory device comprising:
a stacked body that includes a plurality of conductive layers and a plurality of first insulating layers alternately stacked one by one and includes a stepped portion in which the plurality of conductive layers is processed in a stepped shape;
a first pillar that extends in a stacking direction of the stacked body in the stacked body away from the stepped portion in a first direction intersecting the stacking direction and forms a memory cell at each intersection with at least a part of the plurality of conductive layers; and
a plurality of second pillars that extends in the stacking direction in the stacked body in the stepped portion, wherein
the first pillar includes
a second insulating layer extending in the stacked body in the stacking direction,
a semiconductor layer covering a side wall of the second insulating layer,
a third insulating layer covering a side wall of the semiconductor layer,
a fourth insulating layer covering a side wall of the third insulating layer, and
a charge accumulation layer containing a different kind of insulating material from that of the third and fourth insulating layers and interposed between the third and fourth insulating layers, and
each of the plurality of second pillars includes
the second insulating layer extending in the stacked body in the stacking direction,
the semiconductor layer covering the side wall of the second insulating layer,
the third insulating layer covering the side wall of the semiconductor layer, and
the fourth insulating layer covering the side wall of the third insulating layer without interposing the charge accumulation layer between the third and fourth insulating layers.

9. The semiconductor memory device according to claim 8, wherein
the third and fourth insulating layers are oxide layers, and the charge accumulation layer is a nitride layer.

10. The semiconductor memory device according to claim 8, further comprising
a first plate member and a second plate member that extend in the stacking direction and the first direction in the stacked body at positions away from each other in a second direction intersecting the stacking direction and the first direction, wherein
the plurality of second pillars is dispersedly arranged between the first and second plate members.

11. The semiconductor memory device according to claim 8, further comprising:
a contact that is disposed in the stepped portion and connected to one of the plurality of conductive layers; and
a plurality of third pillars that extends in the stacking direction in the stacked body in the stepped portion at positions closer to the contact than the plurality of second pillars is, wherein
each of the plurality of third pillars has a same layer structure as that of the first pillar.

12. The semiconductor memory device according to claim 11, wherein
the plurality of third pillars surrounds the contact when viewed from the stacking direction.

13. The semiconductor memory device according to claim 12, further comprising
a first plate member and a second plate member that extend in the stacking direction and the first direction in the stacked body at positions away from each other in a second direction intersecting the stacking direction and the first direction, wherein
at least a part of the plurality of second pillars is arranged along the first and second plate members.

14. A semiconductor memory device comprising:
a stacked body that includes a plurality of conductive layers and a plurality of insulating layers alternately stacked one by one and includes a stepped portion in which the plurality of conductive layers is processed in a stepped shape;
a first pillar that extends in a stacking direction of the stacked body in the stacked body away from the stepped portion in a first direction intersecting the stacking direction and forms a memory cell at each intersection with at least a part of the plurality of conductive layers; and
a plurality of second pillars and a plurality of third pillars that extend in the stacking direction in the stacked body in the stepped portion, each of the plurality of second pillars and each of the plurality of third pillars having a different layer structure from each other, wherein
each of the plurality of third pillars includes
an oxide layer extending in the stacking direction, and
a nitride layer extending in the stacking direction at a predetermined position of an inner side of the oxide layer, and
each of the plurality of second pillars includes
one or more oxide layers extending in the stacking direction without including the nitride layer.

15. The semiconductor memory device according to claim 14, wherein
each of the plurality of third pillars includes
a first oxide layer extending in the stacked body in the stacking direction,
a semiconductor layer covering a side wall of the first oxide layer,
a second oxide layer covering a side wall of the semiconductor layer,
a first nitride layer covering a side wall of the second oxide layer, and
a third oxide layer covering a side wall of the first nitride layer.

16. The semiconductor memory device according to claim 15, wherein
each of the plurality of second pillars includes
the first oxide layer extending in the stacked body in the stacking direction,
the semiconductor layer covering the side wall of the first oxide layer, the second oxide layer covering the side wall of the semiconductor layer, and the third oxide layer covering the side wall of the second oxide layer.

17. The semiconductor memory device according to claim 15, further comprising
a first plate member and a second plate member that extend in the stacking direction and the first direction in the stacked body at positions away from each other in a second direction intersecting the stacking direction and the first direction, wherein
at least a part of the plurality of second pillars is arranged along the first and second plate members.

18. The semiconductor memory device according to claim 15, further comprising
a contact that is disposed in the stepped portion and connected to one of the plurality of conductive layers, wherein
the plurality of third pillars is disposed at positions closer to the contact than the plurality of second pillars is, and surrounds the contact when viewed from the stacking direction.

19. The semiconductor memory device according to claim 18, wherein
at least a part of the plurality of second pillars surrounds the contact at positions more distant than those of the plurality of third pillars when viewed from the stacking direction.

20. The semiconductor memory device according to claim 18, further comprising:
a fourth oxide layer that covers upper sides of the plurality of conductive layers processed in the stepped shape in the stepped portion and has an upper surface that is substantially flush; and
a second nitride layer that is disposed between the plurality of conductive layers and the fourth oxide layer along the stepped shape of the plurality of conductive layers in the stepped portion and is penetrated by the contact together with the fourth oxide layer.

* * * * *